US008836125B2

(12) United States Patent  (10) Patent No.: US 8,836,125 B2
Eckhardt et al.  (45) Date of Patent: *Sep. 16, 2014

(54) FLEXIBLE ELECTRONIC DEVICES AND RELATED METHODS

(71) Applicant: Premitec, Inc., Raleigh, NC (US)

(72) Inventors: Helmut Eckhardt, Cary, NC (US); Stefan Ufer, Raleigh, NC (US)

(73) Assignee: Premitec, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/950,118

(22) Filed: Jul. 24, 2013

(65) Prior Publication Data

US 2013/0309809 A1 Nov. 21, 2013

Related U.S. Application Data

(63) Continuation of application No. 13/267,314, filed on Oct. 6, 2011, now Pat. No. 8,525,340, which is a continuation of application No. PCT/US2010/038366, filed on Jun. 11, 2010.

(51) Int. Cl.
  *H01L 21/00* (2006.01)
  *H01L 23/48* (2006.01)
(52) U.S. Cl.
  USPC ............................... 257/751; 438/49; 438/56
(58) Field of Classification Search
  USPC ..................... 438/5–13, 48–56; 257/414–470
  See application file for complete search history.

(56) References Cited

U.S. PATENT DOCUMENTS

| | | | |
|---|---|---|---|
| 5,720,099 A | 2/1998 | Parker et al. | |
| 6,129,753 A | 10/2000 | Kuzma | |
| 6,809,414 B1 | 10/2004 | Lin et al. | |
| 7,146,221 B2 | 12/2006 | Krulevitch et al. | |
| 7,417,299 B2 | 8/2008 | Hu | |
| 2006/0225274 A1 | 10/2006 | Greenberg et al. | |
| 2008/0014681 A1 | 1/2008 | Jobetto | |
| 2008/0150088 A1* | 6/2008 | Reed et al. | 257/621 |
| 2009/0256216 A1* | 10/2009 | Kierse | 257/414 |
| 2010/0122704 A1* | 5/2010 | Moenning, Jr. | 128/206.24 |
| 2012/0043667 A1 | 2/2012 | Rathburn | |
| 2012/0112347 A1 | 5/2012 | Eckhardt et al. | |

* cited by examiner

*Primary Examiner* — Karen Kusumakar
(74) *Attorney, Agent, or Firm* — Olive Law Group, PLLC

(57) ABSTRACT

A packaged electronic device includes a flexible circuit structure and a die. The flexible circuit structure includes a first structural layer and electrical conductors. The die is bonded to the flexible circuit structure by a flexible attachment layer. The die includes interconnects in electrical contact with die circuitry and extending through the die, through the flexible attachment layer, and into electrical contact with respective electrical conductors at first ends. A flexible second structural layer is disposed on the die and exposed portions of the electrical conductors, wherein the die and the electrical conductors are encapsulated by the first structural layer and the second structural layer. The first structural layer and/or the second structural layer include a plurality of openings defining respective exposed areas on the electrical conductors at second ends.

22 Claims, 9 Drawing Sheets

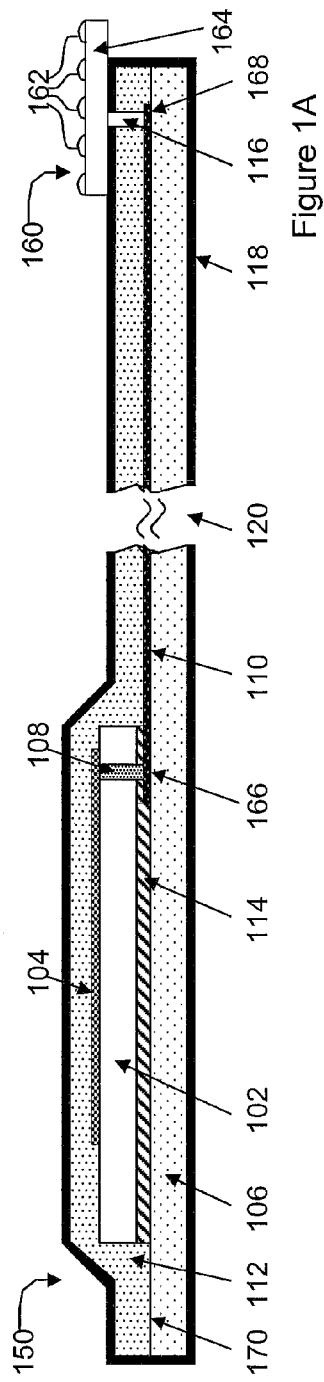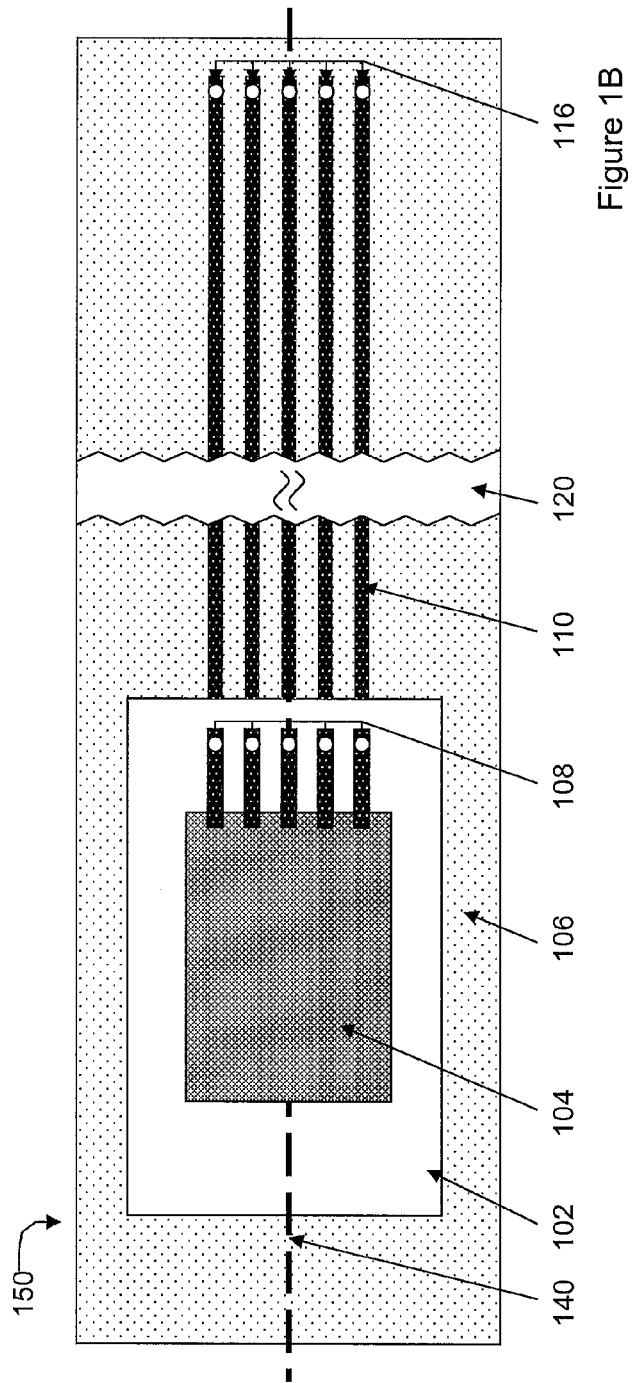

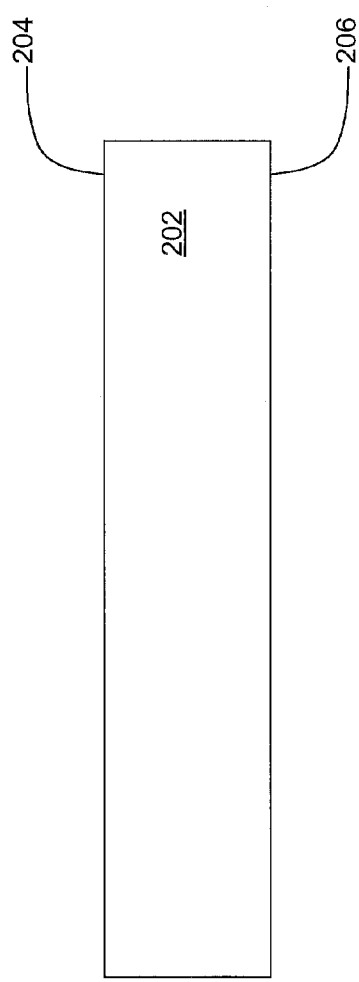
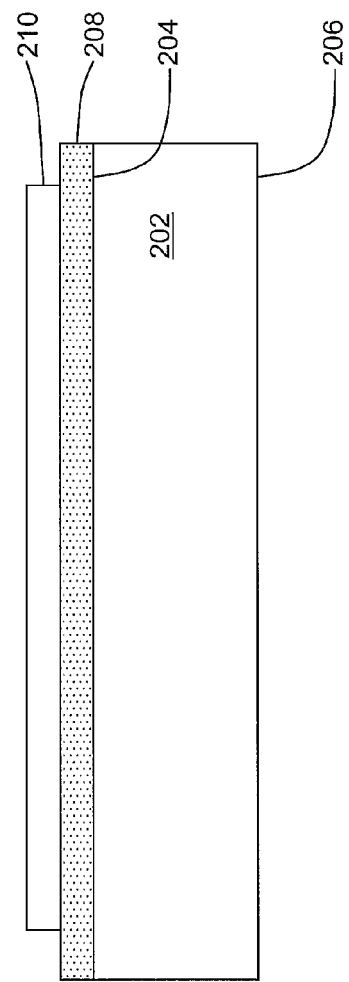

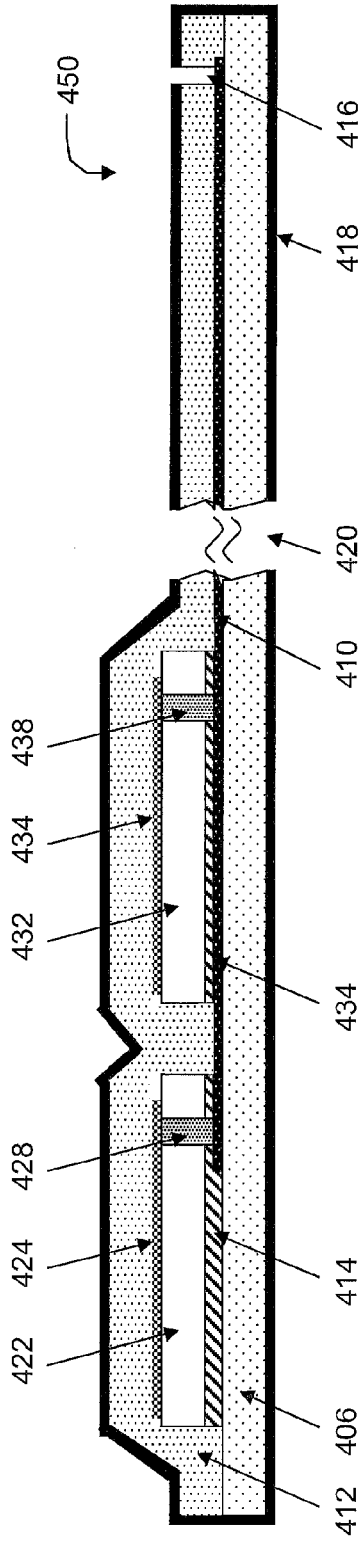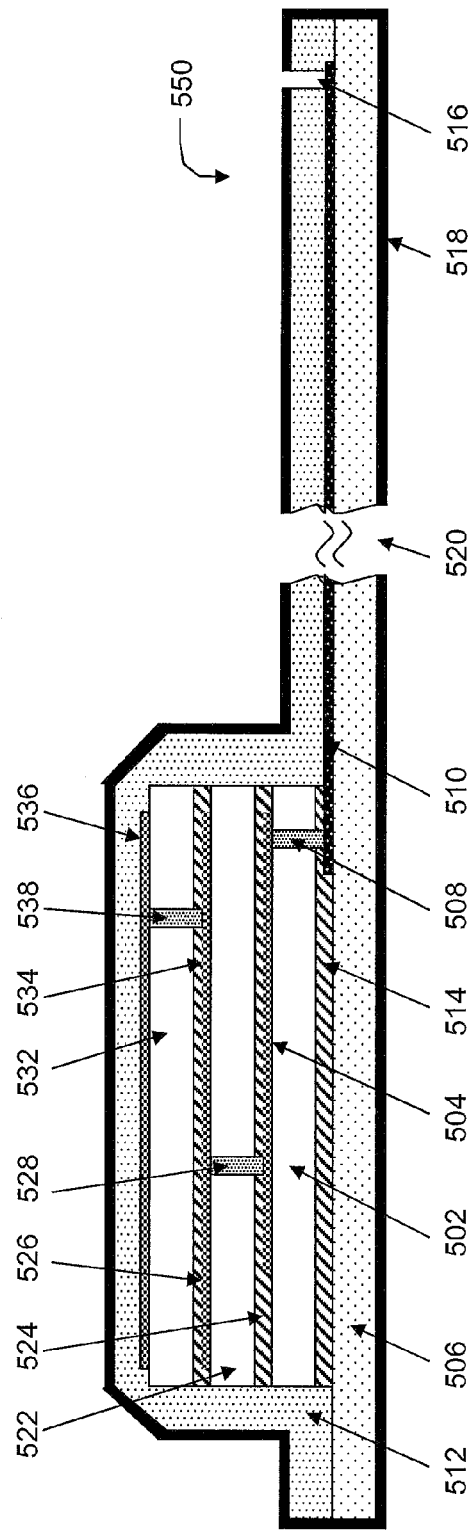

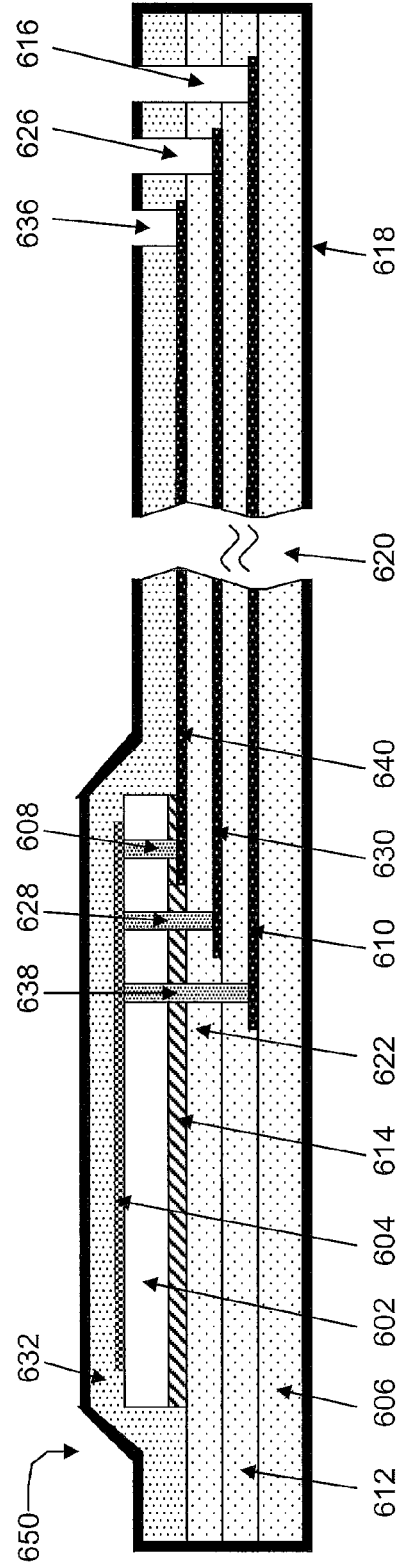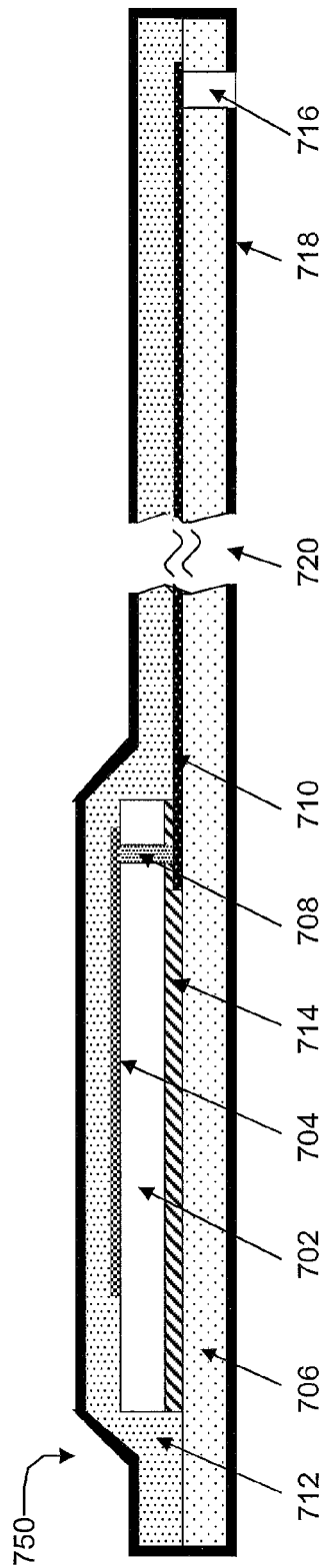

FLEXIBLE ELECTRONIC DEVICES AND RELATED METHODS

RELATED APPLICATIONS

This application is a continuation of U.S. patent application Ser. No. 13/267,314, filed Oct. 6, 2011, titled "FLEXIBLE ELECTRONIC DEVICE AND RELATED METHODS," which is a continuation of International Application No. PCT/US2010/038366, filed Jun. 11, 2010, titled "FLEXIBLE ELECTRONIC DEVICE AND RELATED METHODS", the contents of which are incorporated by reference herein in their entireties.

TECHNICAL FIELD

This invention relates generally to electronic devices and the packaging thereof, including but not limited to hermetic and/or biocompatible packaging or sealing that renders such electronic devices environmentally isolated and/or implantable in vivo or in vitro. More particularly, the invention relates to electronic devices that include flexible circuit structures integrally bonded to and embedded with die structures, and assemblies or systems that include or cooperate with such electronic devices.

BACKGROUND

An ongoing need exists for advances in electronic device miniaturization, packaging of integrated circuits and associated microfabrication technologies to enable new and improved implementations of electronic devices. Up to the present time, flip-chip technology as applied to bare dies has been considered to be the assembly process achieving the highest packing density, smallest footprint and lowest profile. For a detailed discussion of trends and challenges in state-of-the-art chip packaging (chip scale packaging, CSP and flip-chip), see Fjelstad et al., *Chip scale packaging for modern electronics*, Electrochemical Publications Ltd. (2002); Quinones et al., *Flip-chip and chip scale packaging technologies: A historical perspective and future challenge*, SEMICON China 2000 Technical Symposium: A1-A9 (2000). Briefly, in the flip-chip process the die is assembled face down onto the substrate (rigid board or flexible) with an array of solder bumps making electrical connection to the substrate. Reliability of the interconnects in flip-chip has been a great concern in the industry. This is particularly true for bonding to organic substrates because of the difference in thermal expansion coefficients between the chip and the substrate. Usually epoxies are used as underfill materials to make structures mechanically stronger and to improve reliability.

The need for further advances extends to environmentally isolated and/or biocompatible devices. Examples of biocompatible devices include implantable neural prostheses designed to interface with the nervous system to restore lost functions such as movement, hearing or vision. Other examples of neurostimulation devices include, without limitation, devices envisioned for spinal cord stimulation, deep brain and vagus nerve stimulation, sacral nerve stimulation, and gastric electrical stimulation. The requirements for such advanced implants are very different from implant devices found in the market today. The best known and commercially most successful implant is the cardiac pacemaker developed more than 30 years ago. Like the pacemaker, many of the FDA-approved implant devices use rigid packaging like titanium or ceramic casings for hermetic sealing and are equipped with mostly single or low-density microelectrodes for sensing and delivery of electrical stimulation. The electrodes and insulation are "oversized" and the devices are engineered for minimal failure incidents. Therefore, such devices are very bulky, limited in their functionality and require very invasive implantation procedures.

To enable new neurotechnology devices to interface effectively with the nerve system and to open up new applications, miniaturized and more flexible device structures with improved spatial and temporal sensitivity and packaging are needed. For many important applications such as the retinal implant where the shape of the implant structure needs to adapt to the curved shape of the inner eye, the substrate should be flexible to conform to the natural soft-tissue structure. That is, many types of implantable devices should ideally be biocompatible not only in the sense of chemical and biological inertness, but also in the sense of "mechanical" or "structural" biocompatibility, i.e., sufficient physical conformability and flexibility so as not to interact with surrounding tissue in an unwanted manner.

In recent years, researchers have focused on the use of flexible substrates like polyimides (or more recently liquid crystal polymers (LCP), or benzocyclobutene (BCB)) with hybrid assemblies of electronic chips, conduction layers and microelectrode arrays for stimulating and recording, all integrated on the flex substrate. A small footprint, high functionality, high reliability and biocompatibility are desirable attributes for active medical implants. The smaller the device, the less invasive is the procedure of implantation and one can expect better compatibility with surrounding tissue. At the same time, as noted above devices need to be packaged to have a biocompatible tissue interface and to withstand biodegradation in the body. The term biocompatibility in this context refers to mechanical biocompatibility as well as immunological biocompatibility.

The development of flexible polymer carriers for mounting and interconnecting chips and miniaturized components offer the possibility to develop micro-electronic and micro-optical systems that are in direct contact with delicate soft tissues and biological structures. Instead of standard housed IC components, bare or "naked" silicon chips and dies are used for hybrid integration to minimize component dimensions.

Unresolved critical issues in all implantable biomedical applications—and particularly for implanted neural prostheses and other devices envisioned to include flexible polymeric substrates—include packaging, integration and electrical connection of silicon dies or surface mounted electronics with the substrate and electrode arrays. Major challenges include bonding of chips or dies to flexible substrates and packaging of the device including electrical interconnects, connection pads and cables/leads. Protecting the implant from the corrosive effects of the biological fluids has been a particular challenge. Insulating biomaterials intended for implants need to protect devices from the hostile body environment for the lifetime of an implant recipient, sometimes for decades. Not only does the packaging need to withstand biodegradation in the body, but also the materials need to be biocompatible to prevent adverse reactions from the surrounding tissue. To date, the goal of a functional neural implant device that can survive for years in vivo or in vitro has not been achieved.

Several companies use flip-chip processes to produce miniaturized turnkey electronic assemblies for medical implants, micro/miniature wireless devices, and a host of other applications. In addition to solder bumps, flip-chip technology has also employed gold wire stud bumps. Additionally, Parylene coatings have been employed for passivation to assemble a prototype implantable retina prosthesis with secondary receiving power and data coils. Researchers at the University of Utah are developing flip-chip assembly techniques to surface-mount chips directly on the back of a Si probe. See Solzbacher F., *Chronic microelectrode arrays*, Contract NINDS-NIH N01-NS-4-2362 (2004-2008). As a modification of traditional flip-chip processing, a group at the Fraunhofer Institute for Biomedical Engineering, St. Ingbert, Germany has developed a flexible interconnection technology to interconnect chips and surface-mount passive devices (SMD) with ultra-thin highly flexible polyimide (PI) substrates for a retinal implant using gold balls instead of solder bumps to connect the IC and substrate. See Stieglitz et al., *Micromachined, polyimide-based devices for flexible neural interfaces*, Biomed. Microdevices. 2(4): 283-294 (2000); Meyer et al., *High density interconnects and flexible hybrid assemblies for active biomedical implants*, IEEE Trans. Adv. Pack. 24: 366-374 (2001). This new assembly process is known as MicroFlex Interconnection (MFI). First, the PI substrate with metal traces and connection pads with a central via is microfabricated. The vias are aligned with the bond pads of the IC and a gold ball is bonded through the vias in the PI onto the metal pads of the chip utilizing a common thermosonic ball-bumping process. The gold ball acts as a stud or metal "rivet" to electrically connect and mechanically fix the chip or SMD to the substrate. This is a similar bonding scheme to flip-chip with gold studs replacing solder bumps. Because bonding occurs only at the through-via sites in the PI cable, an epoxy material is filled between the ribbon cable and the IC or SMD to improve stability of the connection. See Stieglitz et al., *Micromachined, polyimide-based devices for flexible neural interfaces*, Biomed. Microdevices. 2(4): 283-294 (2000).

Known technologies such as discussed above have not adequately addressed the above-mentioned problems. For instance, even with the use of underfill material, solder bumps, metal balls, rivets, and other conventional interconnects still represent potentially weak connection points, both structurally and electrically, between the chip or die and underlying substrate. These types of interconnects as well as the underfill material may still be prone to degradation in an environmentally or biologically hostile environment. Accordingly, mechanical stability, operational or functional reliability, biocompatibility, service life, etc. are still compromised in conventional packaged electronic devices. Moreover, sufficient miniaturization as needed for advanced devices such as electrostimulation devices has not been attained. As an example in the case of an intraocular implant such as an artificial retina, it is estimated that up to 1000 electrical neurostimulation sites are needed to restore useful vision in blind people. See Margalit et al., *Retinal prosthesis for the blind*, Survey Ophth. 47: 334-356 (2002). Currently, state-of-the-art retina chips have been designed and fabricated in the standard CMOS process with 1.5-µm feature size through the MOSIS foundry (Marina Del Rey, Calif.) to address up to 64 sites on a 4.6 mm×4.6 mm chip at the University of Michigan. See Ghovanloo et al., *A modular 32-site wireless neural stimulation microsystem*, IEEE J. Sol. State Cir. 39:1-10 (2004). Other groups in the USA and in Europe have built chips with similar capabilities and size. See Liu et al., *A neuro-stimulus chip with telemetry unit for retinal prosthetic device*, IEEE J. Sol. State Cir. 35: 1487-1497 (2000). It is not clear whether current technology is sufficient to enable engineers to design and build the circuitry to stimulate 1000 sites and package the circuitry into a single chip with this footprint because of limitations in the I/O and connections to substrate and the required voltage to stimulate neurons. Most likely, through the use of current technology, several chips would need to be mounted on the flex substrate to attain the required performance and functionality.

Therefore, in view of the foregoing, despite some advances in microfabrication technologies pertaining to packaged electronic devices, it is well-recognized by persons skilled in the art that an ongoing need exists for providing improved packaged electronic devices and related methods, apparatus and systems.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a packaged electronic device includes a flexible circuit structure and a die. The flexible circuit structure includes a first structural layer and a plurality of electrical conductors disposed on the first structural layer. The plurality of electrical conductors includes a plurality of respective first ends and a plurality of respective second ends. The die includes a first surface, an opposing second surface, and die circuitry formed on the first surface. The die is bonded to the flexible circuit structure by a flexible attachment layer interposed between the second surface and the first structural layer. The die further includes a plurality of through-wafer interconnects in electrical contact with the die circuitry and extending through the die, through the flexible attachment layer, and into electrical contact with the respective electrical conductors at the first ends. A flexible second structural layer is disposed on the die and exposed portions of the electrical conductors, wherein the die and the electrical conductors are encapsulated by the first structural layer and the second structural layer. The first structural layer and/or the second structural layer include a plurality of openings defining respective exposed areas on the electrical conductors at the second ends.

According to another implementation, a method for fabricating a packaged electronic device is provided. A plurality of electrical conductors is formed on a first structural layer. An attachment layer is deposited on the electrical conductors and the first structural layer. A die including die circuitry is placed on the attachment layer. A plurality of interconnects is formed. The interconnects extend from the die circuitry, through the die, through the attachment layer, and into contact with respective electrical conductors. A second structural layer is deposited on the die and exposed portions of the electrical conductors, wherein the first structural layer and the second structural layer encapsulate the die, the die circuitry and the electrical conductors. A plurality of openings is formed through first structural layer and/or the second structural layer to expose respective areas of the electrical conductors.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 1A is a cross-sectional elevation view of an example of a packaged electronic device operatively communicating with another electronic device, according to certain implementations of the present disclosure.

FIG. 1B is a plan view of the packaged electronic device illustrated in FIG. 1, with the other electronic device and certain structural features removed.

FIGS. 2A-2J are cross-sectional elevation views illustrating an example of a method for fabricating a packaged electronic device such as the device illustrated in FIGS. 1A and 1B.

FIG. 4 is a cross-sectional elevation view of another example of a packaged electronic device in which a plurality of die is incorporated in a planar arrangement along the length of the device.

FIG. 5 is a cross-sectional elevation view of another example of a packaged electronic device in which a plurality of die is incorporated in a stacked arrangement along the height of the device.

FIG. 6 is a cross-sectional elevation view of another example of a packaged electronic device in which multiple layers of electrical conductors are provided.

FIG. 7 is a cross-sectional elevation view of another example of a packaged electronic device in which openings to exposed areas of electrical conductors are provided on a side of the electrical conductors opposite to a die of the packaged electronic device.

DETAILED DESCRIPTION

Figure 2C:
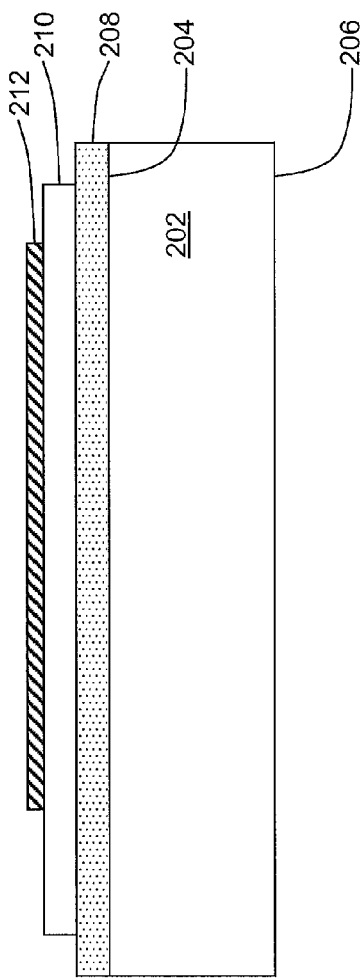

For convenience, the term "implantable" as used herein is intended to encompass not only devices that may be installed and operated within a living organism but also devices that may be attached to the outer skin of a living organism.

As used herein, the term "biocompatible," in the context of a material or device intended for in vivo implantation, generally means that the material or device after implantation will not have toxic or otherwise injurious effects at the local level (e.g., surrounding tissue) or systemic level. "Biocompatible" also means structurally or mechanically compatible, in that the material or device after implantation is able to perform its intended function or provide its intended therapeutic effects while minimizing adverse physical effects in surrounding tissue. Generally, a structurally or mechanically compatible material or device is sufficiently flexible so as to be conformable with the surrounding tissue.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

For purposes of the present disclosure, it will be understood that when a given layer (or film, region, substrate, component, device, structure, or the like) is referred to as being "on" or "over" another layer, or "bonded to" another layer, that given layer may be directly or actually on (or over, or bonded to) the other layer or, alternatively, intervening layers (e.g., buffer layers, transition layers, interlayers, sacrificial layers, etch-stop layers, masks, electrodes, interconnects, contacts, or the like) may also be present. A given layer that is "directly on" another layer at the juncture between the two layers, or "bonded directly to" another layer, means that no intervening layer is present, unless otherwise indicated. It will also be understood that when a given layer is referred to as being "on" (or "over") another layer, or "bonded to" another layer, that given layer may cover the entire surface of the other layer or only a portion of the other layer. It will be further understood that terms such as "formed on," "disposed on," "bonded to" and the like are not intended to introduce any limitations relating to particular methods of material transport, deposition, fabrication, surface treatment, or physical, chemical, or ionic bonding or interaction, unless otherwise indicated.

As used herein, the term "die" refers to a piece or body of material on and/or into which electronic (or electrical) circuitry (i.e., die circuitry) has been fabricated. Typically in the context of integrated circuits, as appreciated by persons skilled in the art, several copies of the same integrated circuit may be fabricated on a relative large wafer or substrate of semiconducting material. The semiconducting wafer is then separated into several pieces, with each resulting piece being a die containing a respective one of the circuits. In the context of the present disclosure, however, the material comprising the die, or in the case of dicing operations the larger substrate from which the die is formed, is not limited to being a semiconducting material.

FIGS. 1A and 1B illustrate an example of a packaged electronic device 150 fabricated in accordance with any of the implementations taught in the present disclosure. FIG. 1A is a cross-sectional elevation view of the packaged electronic device 150, while FIG. 1B is a corresponding plan view of the packaged electronic device 150 with certain features or components removed for illustrative purposes. The cross-section of FIG. 1A is taken along line 140 of FIG. 1B.

Referring to FIG. 1A, the packaged electronic device 150 includes a die 102 integrally bonded to a flexible circuit structure 170 (consisting of structural layers 106, 112, and electrical conductors 110) by means of an attachment layer 114. The flexible circuit structure 170 includes electrical conductors 110 disposed on or embedded in a first structural layer 106. The die 102 may include one or more active and/or passive circuitry devices (die circuitries) 104 in signal communication with electrical contacts provided on or in the die 102. The die 102 has through-wafer-interconnect structures 108 which provide signal communication between the circuitry devices 104 formed on one side of the die 102 and the embedded electrical conductors 110 of the flexible circuit structure 170 bonded to the opposing side of the die 102. The top side and all lateral sides of the die 102, as well as the electrical conductors 110, are encapsulated by a flexible insulating film (or second structural layer) 112 such that the die 102 and the electrical conductors 110 are completely embedded within flexible material (i.e., the first structural layer 106 and the second structural layer 112 in the present example). An additional conformal protective and biocompatible barrier layer 118 may be applied to cover all exposed surfaces of the article. Openings 116 may be patterned in the protective barrier layer 118 and in the flexible insulating film 112 to expose portions of the electrical conductors 110. These openings 116 enable signal communication between the device 150 and the bio-physiological environment. Alternately, these openings 116 may be filled with electrical interconnects or contacts, or occupied by wires, as needed to enable signal communication between the circuitry devices 104 and another electronic device 160 via the electrical conductors 110. In the illustrated example, the electrical conductors 110 include respective first ends 166 with which the interconnect structures 108 are in signal communication and respective second ends 168 with which the conductive structures of the openings 116 are in signal communication. In this context, the term "end" is not limited to an extreme boundary or edge of any electrical conductor 110 but instead more generally designates an end region of the electrical conductor 110. That is, the first ends 166 may be end regions proximal to the die 102 and remote from the other electronic device 160, while the second ends 168 may be end regions proximal to the other electronic device 160 and remote from the die 102.

As further shown in FIGS. 1A and 1B, in some implementations the flexible circuit structure 170 may be appreciably long in one dimension so as to define a flexible cable portion 120 capable of carrying signals from the circuitry devices 104 to the other electronic device 160, which may thus be remotely situated relative to the circuitry devices 104. The remote device 160 may be any device that would benefit from cooperation with the die 102 on the packaged electronic device 150. The remote device 160 may be placed in signal communication with the circuitry devices 104 via any suitable electrical connection made through the openings 116 over the electrical conductors 110.

As non-limiting examples, the remote device 160 may be an electro-stimulation device configured for neurostimulation (for example retinal or cranial prosthesis), muscular stimulation, or the like. In such a case the remote device 160 may, for example, include an array of electrodes 162 disposed on a suitable substrate 164. Other examples of remote devices include, but are not limited to, various sensors or detectors (including sensors or detectors that acquire measurements of a desired property such as electrical signals, temperature, pressure, etc., provide an indication of a certain condition such as gas detection, biosensors, chemical sensors, etc.), optical devices, image capturing devices, radio-frequency (RF) communication devices, electro-mechanical devices, micro-electro-mechanical systems (MEMS), labs-on-a-chip, etc. The packaged electronic device 150 in combination with the remote device 160 may comprise a biocompatible electronic assembly (or device, apparatus, system, instrument, etc.) suitable for in vivo implantation. The flexibility of the cable portion 120 likewise provides significant flexibility in the design, function and operation of such an implantable electronic assembly. For instance, in the case of a retinal prosthesis, both the packaged electronic device 150 and the remote device 160 may be implanted within the eye. Alternatively, the remote device 160 may be situated outside the eye while nevertheless remaining tethered to the packaged electronic device 150 via the cable portion 120 of the flexible circuit structure 170, which may extend through the outer tissue of the eye by means of a surgical incision. Likewise, in the case of a brain signal recording device, both the packed electronic device 150 and the remote sensor 160 may be implanted in the brain. Alternatively, the remote sensor 160 may be implanted and the electronic device 150 remains outside the brain fixed to the skull but tethered to the sensor 160 via a cable portion 120 of the flexible circuit structure 170.

The resulting article illustrated in FIGS. 1A and 1B is a fully encapsulated packaged electronic device 150. The total thickness of the cable portion 120 may range, for example, from 5 μm to 200 μm. The total thickness of the encapsulated electronic device 150 including the die 102 may range, for example, from 15 μm to 250 μm. In advantageous implementations, the die 102 itself is flexible and thereby imparts additional flexibility to the packaged electronic device 150. The degree of flexibility of the die 102 will depend on its composition and thickness. In a typical example, die 102 is a semiconducting material such as, for example, silicon, a semiconducting silicon-inclusive compound or alloy, a Group III-V compound, a Group II-VI compound, or any other semiconducting material that is flexible in the range of thicknesses contemplated for the present teachings. As examples, the thickness of the die 102 may range from 10 μm to 50 μm, or more typically from 10 μm to 30 μm. In one specific example, the die 102 is silicon and has a thickness of about 23 μm to 25 μm and a planar area of 5 mm by 5 mm. More generally, the die 102 may be a semiconductor, compound semiconductor, metalloid (or metalloid-inclusive compound or alloy), ceramic, glass, polymer, or metal (or metal-inclusive compound or alloy). In some implementations, the die 102 is thin enough (and hence flexible enough) such that when the packaged electronic device 150 is rolled end to end into a cylinder (e.g., when the packaged electronic device 150 shown in FIG. 1A is bent such that the left end meets the right end), the outermost radius of the packaged electronic device 150 is 1 mm or less.

The packaged electronic devices fabricated according to the implementations described herein are expected to perform well during in vitro testing, protect the underlying conductors and microelectrodes in isotonic saline solutions at 37 degrees Celsius (human body temperature) for several years and at the same time exhibit good biocompatibility. Accordingly, as noted throughout the present disclosure, the electronic devices taught herein are useful not only in more general or conventional applications but also in applications entailing environmental isolation or in vivo implantation.

FIGS. 2A-2J illustrate an example of a method for fabricating a packaged electronic device that includes a die integrated with a flexible circuit structure in accordance with the present teachings, such as, for example, the packaged electronic device 150 illustrated in FIGS. 1A and 1B.

Referring to FIG. 2A, a rigid sacrificial substrate or wafer 202 is provided. The substrate 202 may have any suitable composition and thickness, so long as the substrate 202 is rigid enough to serve as a free-standing substrate capable of supporting the building of a flexible circuit structure as described below. Moreover, the substrate 202 must be compatible with the process steps taken to build the flexible circuit structure. For instance, in cases where the building of the flexible circuit structure entails thermal curing, the substrate 202 must be capable of withstanding such thermal curing. As other examples, again depending on the process undertaken for fabricating the flexible circuit structure, the substrate 202 may also need to be compatible with developer chemicals, etchants, etc. The substrate 202 may be electrically conductive, semiconducting, or insulating. The substrate 202 may be an elemental metalloid or semiconductor (e.g., silicon), a semiconductor compound or alloy, a glass, a ceramic, a dielectric, a polymer, or a metal. In one non-limiting example, the substrate 202 is a silicon wafer having a thickness (in the vertical direction from the perspective of FIG. 2A) of 250 μm. The substrate 202 includes a first surface 204 and an opposing second surface 206, the thickness of the substrate 202 being generally defined as extending between and including the first surface 204 and the second surface 206.

In this context, terms such as "first" and "second" are arbitrary as no limitations are placed on a particular orientation of the substrate 202 or any other component of the packaged electronic device being described. For instance, either the first surface 204 or the second surface 206 could be a bottom surface, an inside surface, a top surface, an outside surface, etc. Moreover, it will be understood that the illustrated substrate 202 may represent a portion or section of a full wafer of substrate material. Accordingly, persons skilled in the art will appreciate that FIGS. 2A-2J may be representative of the use of a large wafer or substrate 202 and the simultaneous microfabrication of several packaged electronic devices.

Referring to FIG. 2B, a sacrificial release film 208 is formed on the first surface 204 of the substrate 202. The release film 208 may have any composition suitable for serving as a sacrificial material. As non-limiting examples, the release film 208 may be a metal (e.g., Al, Cr, etc.), an oxide (e.g., $SiO_2$), a nitride (e.g., $Si_3N_4$), or a polymer. The release film 208 may formed by any technique suitable for its composition. As an example, in the case of a metal release film 208 such as Al or Cr, the release film 208 may be formed by sputter deposition according to known techniques. No specific limitation is placed on the thickness of the release film 208.

Continuing with FIG. 2B, a first structural layer 210 is formed on the sacrificial release film 208 by any technique suitable for the composition of the first structural layer 210, and which results in the first structural layer 210 covering the sacrificial release film 208 in an area that defines the overall footprint of the final packaged electronic device. The first structural layer 210 may have any suitable electrically insulating composition for this purpose. In addition, the as-deposited material of the first structural layer 210 should be flexible. A few non-limiting examples include polymers such as polyimide (which includes copolymers of polyimide and blends of polyimide), polyparaxylylene (e.g., the class of Parylenes), liquid-crystal polymers (LCPs), and benzocyclobutene (BCB). The polymer may or may not be photo-definable. In advantageous implementations, the first structural layer 210 is a polymer of the type that can be deposited by a spin-on coating process although other material-additive processes such as dip coating may be suitable. In further advantageous implementations, the first structural layer 210 is a polymer that includes an adhesion promoter, one specific example being a photo-definable polyimide precursor solution such as commercially available from HD Microsystems, Parlin, N.J. and designated Pyralin® PI2723 or also commercially available from Fujifilm Electronic Materials U.S.A. Inc., Queen Creek, Ariz. and designated Durimide 7020. The adhesion promoter may be of the type designed to provide covalent bonds to the surface of the component to be subsequently placed or deposited on the first structural layer 210 such as an electrically conductive layer, a die, another structural layer utilized for adhesion or encapsulation, etc. Generally, an adhesion promoter may be selected for use in conjunction with a variety of compositions of the surface of the sacrificial release film 208, including silicon, glass, quartz, ceramics, metals, inorganic oxides, inorganic nitrides, and polyimides. The portion of the first structural layer 210 that covers the release film 208 may have any suitable thickness. As an example, the thickness of the first structural layer 210 may range from 2 µm to 100 µm. In one specific example, the thickness of the first structural layer 210 is 10 µm.

As an alternative or in addition to the first structural layer 210 including a built-in adhesion promoter, an adhesion promoter may be applied as an external layer (or film, coating, etc., not specifically shown) may be applied on a surface of the first structural layer 210 prior to depositing a component (e.g., an electrically conductive layer, a die, another structural layer utilized for adhesion or encapsulation, etc.) on the first structural layer 210 to enhance bonding between that component and the first structural layer 210. The external adhesion promoter may have any composition suitable for this purpose, one example of which is a silanizing agent. The external adhesion promoter may be applied by spin-on coating, spray-on coating, dip coating, or the like. The external adhesion promoter may be in the nature of a surface treatment. In addition to wet surface treatments, a dry surface treatment such as exposure to a plasma beam may be performed for surface functionalization, as appreciated by persons skilled in the art.

Referring to FIG. 2C, electrical conductors (e.g., traces) 212 are formed so as to extend along at least a portion of the first structural layer 210. In a typical implementation contemplated by the present teachings, the material utilized for forming the electrical conductors 212 is a metal or metal alloy. The metal or metal alloy may be deposited by any suitable technique, such as a vacuum deposition technique, for instance a physical vapor deposition (PVD) technique such as sputtering. In some implementations, two or more layers of different metals are deposited to form the electrical conductors 212. As an example, the metallization may consist of first depositing Cr followed by depositing Au, where Cr may serve primarily as an adhesion layer. The portion of the metal film that covers the first structural layer 210 may have any suitable thickness. In one specific example entailing the deposition of a bilayer of Cr and Au, the thickness of the Cr is 20 nm and the thickness of the Au is 200 nm. As one non-limiting example of forming the electrical conductors 212, the deposited metal film is patterned by utilizing a photoresist etch mask (e.g., Shipley 1813, commercially available from Shipley Co. Inc., Freeport, N.Y.) and chemical wet etchants to define the electrical conductors 212.

Figure 2D:
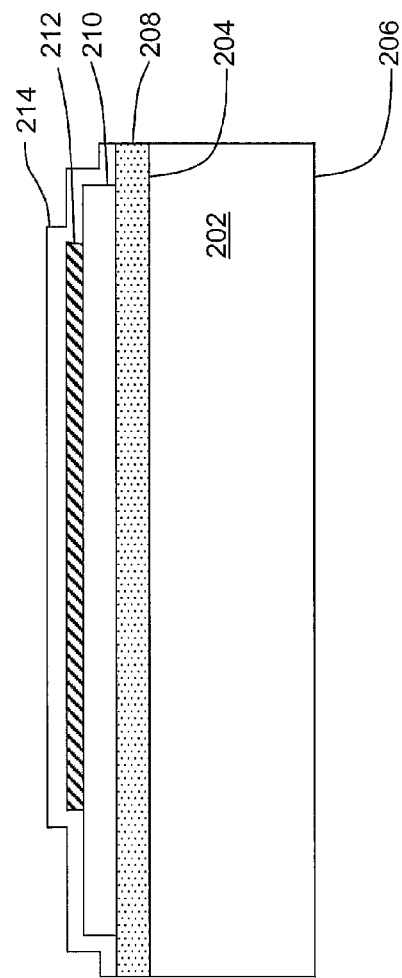

Referring to FIG. 2D, another structural layer, which will be referred to herein as an attachment layer 214, is deposited so as to conformally cover the electrical conductors 212 as well as all exposed surfaces of the first structural layer 210 and the sacrificial release film 208. The attachment layer 214 may have any suitable electrical insulative composition for this purpose, should be flexible, and should adhere well to both the first structural layer 210 and the die to be attached as will be explained below. The attachment layer 214 may be deposited by any technique suitable for its composition and have any suitable thickness. The first structural layer 210 may be cured, such as by thermal curing (heat application), prior to depositing the attachment layer 214. In one implementation, the composition of the attachment layer 214 is the same or similar as that of the first structural layer 210 (e.g., polyimide). In some implementations, the thickness of the attachment layer 214 (above a given surface, such as that of the first structural layer 210) ranges from 0.5 µm to 5 µm, in other implementations from 1 µm to 4 µm. In some specific examples, the thickness is 2 µm or 3 µm. More generally, the thickness of the attachment layer 214 should be sufficient for providing a robust bond between the electrical conductors 212 and first structural layer 210 and the die to be subsequently placed thereon, while not impairing the flexibility of the electronic device being fabricated and not appreciably adding to the overall thickness of the electronic device. A built-in adhesion promoter, external adhesion promoter or surface treatment may be employed as described above to facilitate or enhance this bond. It will be understood that a term such as "adhere" or "bond" when used in the context of the attachment layer 214 indicates that the attachment layer 214 promote or enhances attachment of the die to the underlying surface (i.e., the first structural layer 210 in this case), in that the attachment layer 214 is still tacky when applied and when the die is subsequently placed on the attachment layer 214 and aligned properly with the underlying electrical conductors 212. That is, the attachment layer 214 is not the same as an adhesive dry film, liquid adhesive, thermosetting adhesive, pressure-sensitive adhesive, underfill material, or the like. These latter, conventional materials are typically much thicker and function solely as adhesives, glues or space-filling materials.

Figure 2E:
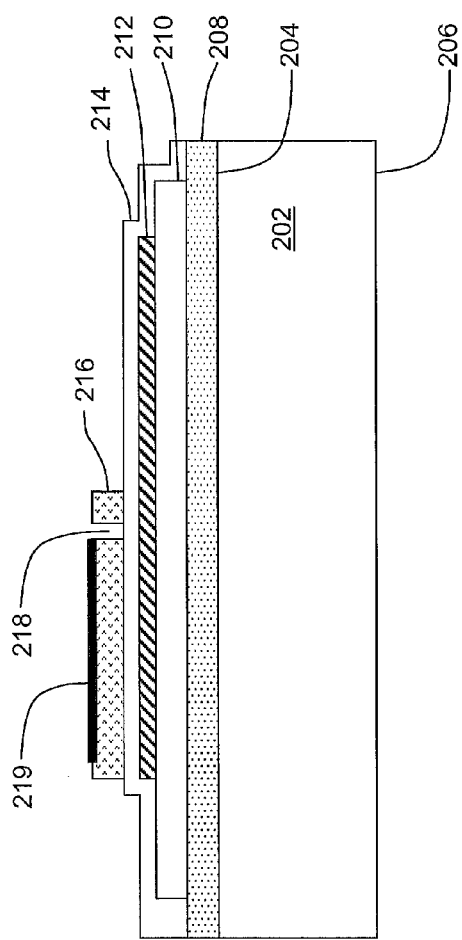

Referring to FIG. 2E, a die 216 is aligned and attached to the attachment layer 214 over a predefined area of the electrical conductors 212. At this time, the attachment layer 214 is not yet cured or may be only partially cured so as to provide tackiness for the die 216. The die 216 includes die circuitry 219 (e.g., one or more electrical circuits or devices) formed at (on and/or into) one of the die 216 surfaces (the top surface as oriented in FIG. 2E) by any suitable technique. The specific technique selected may depend on a number of factors, including the features and/or functions of the die circuitry 219. The die circuitry 219 may include active attributes (e.g., transistors, p-n junctions, active sensors, etc.) and/or passive attributes (e.g., resistors, capacitors, inductors, thermistors, conductive leads, ground planes, passive sensors, etc.). Additionally, the die 216 includes one or more through-wafer-holes 218 which extend between the two surfaces of the die 216. The die 216 is aligned and placed on the attachment layer 214 in such a way that the through-wafer-holes 218 are directly above the appropriate electrical conductors 212. This alignment and placement may be by any appropriate manual or automated means. The composition and thickness of the die 216 may be as described earlier in this disclosure.

The through-wafer-holes 218, which extend through the entire thickness of the die 216, may be formed by any means suitable for the composition of the die 216 and utilized in precision microfabrication, such as for example mechanical drilling (typically with the use of a diamond drill bit), laser drilling, ultrasonic milling, chemical etching, or dry etching. In the case of a silicon wafer or the like, deep reactive ion etching or DRIE (e.g., the Bosch process) may be utilized. The diameter of the through-wafer-holes 218 may range from 4 µm to 100 µm. The pitch of (or spacing between) the through-wafer-holes 218 may range from 10 µm to 1000 µm. In one specific example, the diameter of the through-wafer-holes 218 is 50 µm and the pitch of the through-wafer-holes 218 is 150 µm. The through-wafer-holes 218 may be formed either prior to or subsequent to die 216 placement onto the attachment layer 214. The case illustrated is that of the through-wafer-holes 218 formed prior to die 216 placement. The sidewalls of the through-wafer-holes 218 may be covered with a conformal layer of insulation (not shown) to electrically insulate the bulk material of the die 216 from subsequently fabricated electrically conductive interconnects. Any suitable insulating material that can be applied by conformal deposition may be utilized, a few examples being oxides such as $SiO_2$, nitrides such as $Si_3N_4$, and the class of Parylenes. Any deposition method suitable for the composition of the insulating layer may be employed. One typical example is a vacuum deposition technique such as chemical vapor deposition (CVD).

Figure 2F:
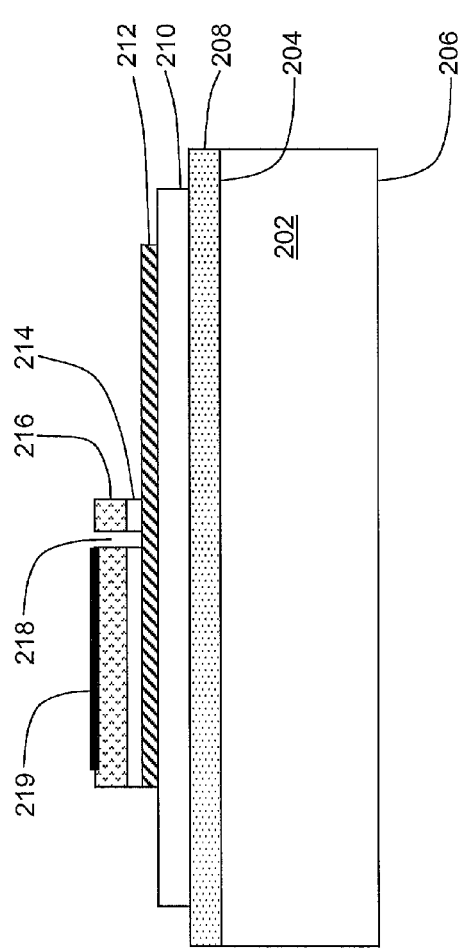

Referring to FIG. 2F, the areas of the attachment layer 214 that are not directly covered by the die 216, including the areas of the attachment layer 214 exposed by the through-wafer-holes 218, are removed by any suitable means. In one non-limiting example, this removal is accomplished by reactive ion etching where the die 216 acts as a physical mask to protect the portion of the attachment layer 214 directly under the die 216.

Figure 2G:
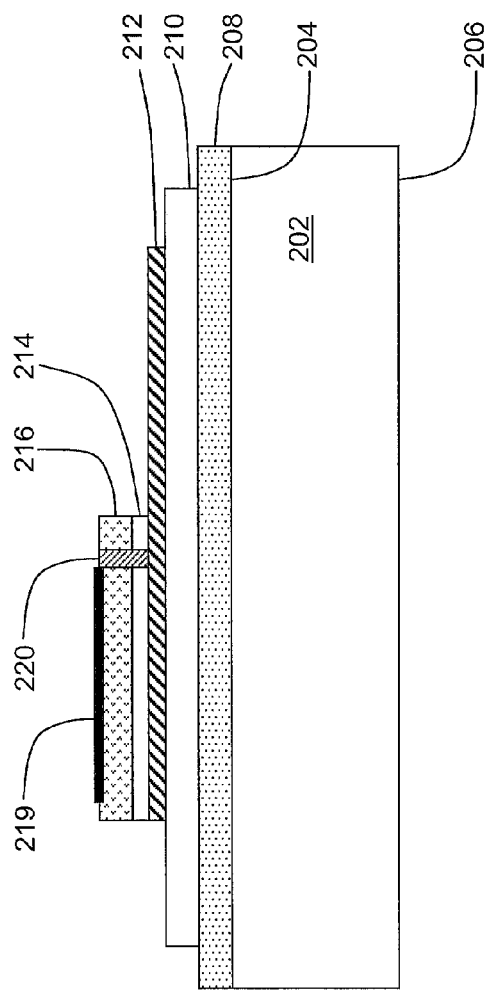

Referring to FIG. 2G, electrically conductive interconnects 220 are deposited in the through-wafer-holes 218 to electrically connect the die circuitry 219 to the electrical conductors 212. These electrical conductive interconnects 220 may completely fill, partially fill, or only coat the sidewalls of the through-wafer-holes 218 with the requirement being a robust electrical connection between the die circuitry 219 and the electrical conductors 212 to enable reliable signal communication. The electrically conductive interconnects 220 may be formed by any suitable means including, but not limited to, physical vapor deposition (PVD), electroplating, screen-printing, etc.

Figure 2H:
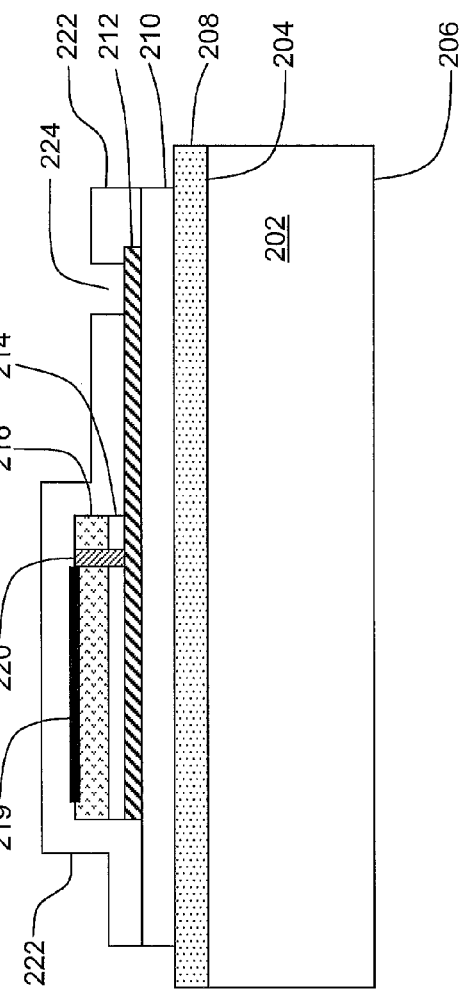

Referring to FIG. 2H, a second structural layer 222 is conformally deposited so as to encapsulate the die 216 and the electrical conductors 212 while leaving openings 224 that define electrical contact areas on the electrical conductors 212. The composition of the second structural layer 222 may be the same or different from that of the first structural layer 210 and/or the attachment layer 214. The second structural layer 222 may be deposited by any technique suitable for its composition. In some implementations, the second structural layer 222 is polyimide. The second structural layer 222 may have any suitable thickness, but generally must be thick enough to form an adequately conformal layer and hence may depend in part on the thickness of the die 216. As an example, the thickness of the second structural layer 222 (over a given surface such as that of the die 216) may range from 2 µm to 100 µm. In one specific example, the thickness of the second structural layer 222 is 10 µm. The second structural layer 222 may include a built-in adhesion promoter, or alternatively an external adhesion promoter or surface treatment may be applied as noted above, to facilitate or enhance conformal coverage of the underlying surfaces or components on which the second structural layer 222 is deposited. To render full encapsulation of the die 216 and the electrical conductors 212, portions of the second structural layer 222 may be directly deposited on corresponding portions of the first structural layer 210.

Figure 2I:
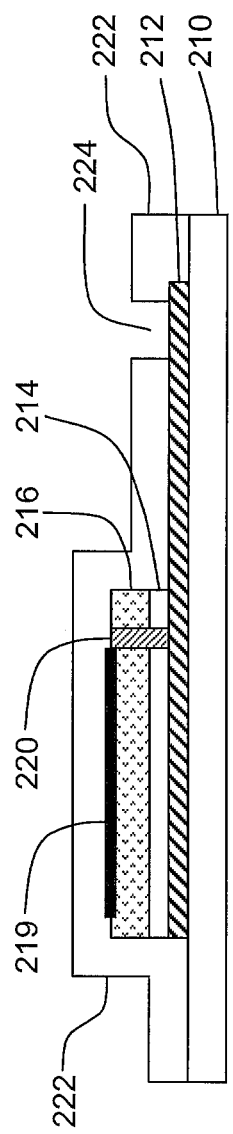

Referring to FIG. 2I, the sacrificial release film 208 (FIGS. 2B-2H) is removed by any means suitable for the composition of the release film 208, therefore separating the first structural layer 210 from the substrate 202 (FIGS. 2A-2H). This removes the packaged electronic device being built from the rigid substrate 202 (FIGS. 2A-2H) that was used for handling and support during the prior processing steps described above.

Figure 2J:
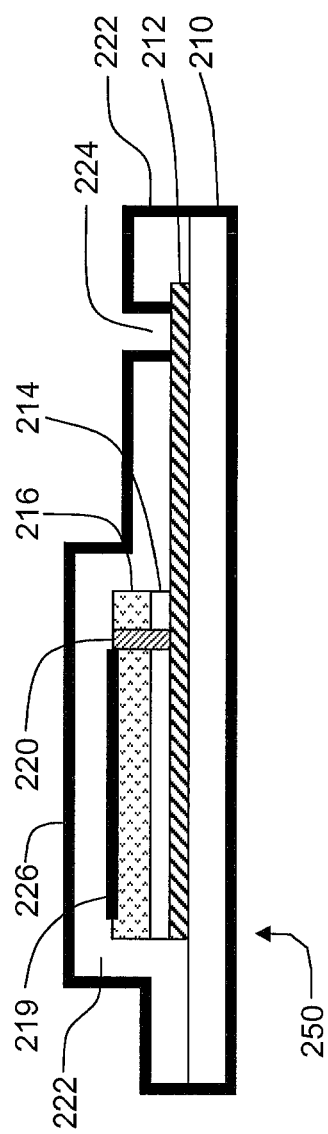

Referring to FIG. 2J, to provide enhanced protection, an additional barrier coating 226 (film, layer, etc.) may be optionally deposited onto the first structural layer 210 and the second structural layer 222 including the sidewalls of these layers. The barrier coating 226 may be patterned so as to maintain the openings 224 defined by the second structural layer 222. The barrier coating 226 may have any suitable composition utilized in the packaging of electronics. In implementations where the packaged electronic device described herein is intended for in vivo or in vitro implantation and operation, the barrier coating 226 should be biocompatible. In some implementations, the barrier coating 226 has a diamond-like carbon (DLC) inclusive composition, which may be conformally deposited by, for example, plasma-enhanced chemical vapor deposition (PECVD) utilizing a known precursor material such as, for example, an appropriate hydrocarbon such as methane. Patterning may be accomplished by, for example, a standard photoresist lift-off procedure. The barrier coating 226 may have any suitable thickness. In one specific example, the thickness of the barrier coating 226 is 300 nm. The surface properties of the DLC films utilized in this example can be engineered to yield hydrophilic or hydrophobic surface properties to improve biocompatibility, such as by adding appropriate dopants (e.g., oxygen, fluorine, etc.) or by performing a surface treatment (e.g., surface functionalization) such as plasma or wet treatment. The DLC films exhibit excellent adhesion to most plastic substrates and metals, can be easily patterned, and exhibit low moisture and oxygen permeabilities. Some examples of suitable DLC-inclusive films are described in U.S. Patent App. Pub. No. US 2002/0172938, the entirety of which is incorporated herein by reference. Other examples of the barrier coating 226 include, but are not limited to, a Parylene, amorphous $SiO_2$, and amorphous $Si_3N_4$ or combinations of the foregoing. Additional descriptions of barrier coatings 226 are provided below.

Depending on the specific design or purpose of the end-use article, the openings 224 (FIG. 2J) to the electrical conductors 212 may be filled with an electrically conductive material to provide electrode contacts such as, for example, bond pads (not shown). As one example, the openings 224 may be filled with a Pt—Ir alloy by sputter-deposition.

In implementations where the outermost surfaces of the packaged electronic device 250 (e.g., the barrier layer 226 and/or the first structural layer 210 and the second structural layer 222) are composed of biocompatible materials, the resulting electronic device 250 is suitable for in vivo or in vitro implantation and operation. Moreover, it can be seen that the die 216 and the first structural layer 210 are fully integrated with each other as a unitary electronic device 250 via the thin attachment layer 214, which as described above may be characterized as an additional structural layer or an extension of the first structural layer 210 (particularly when the attachment layer 214 and the first structural layer 210 have the same composition) and provides tackiness at a stage of fabrication when the first structural layer 210 may no longer provide sufficient tackiness to ensure good bonding with the die 216. Thus, there is no separation of the die 216 and the first structural layer 210 by solder bumps, layers of underfill materials, or other features conventionally required for spacers, electrical interconnects, structural rigidity, and the like. As a consequence, intimate contact is formed between the die 216 and the first structural layer 210 with improved seals for all points of electrical contact, improved biocompatibility, and increased mechanical stability of the areas of contact between the die 216 and the first structural layer 210. Hence, many of the potentially weak connection points in this type of device are eliminated and the electrical components of the die 216 and the electrical conductors 212 are intrinsically encapsulated by the microfabrication process.

Figure 3:
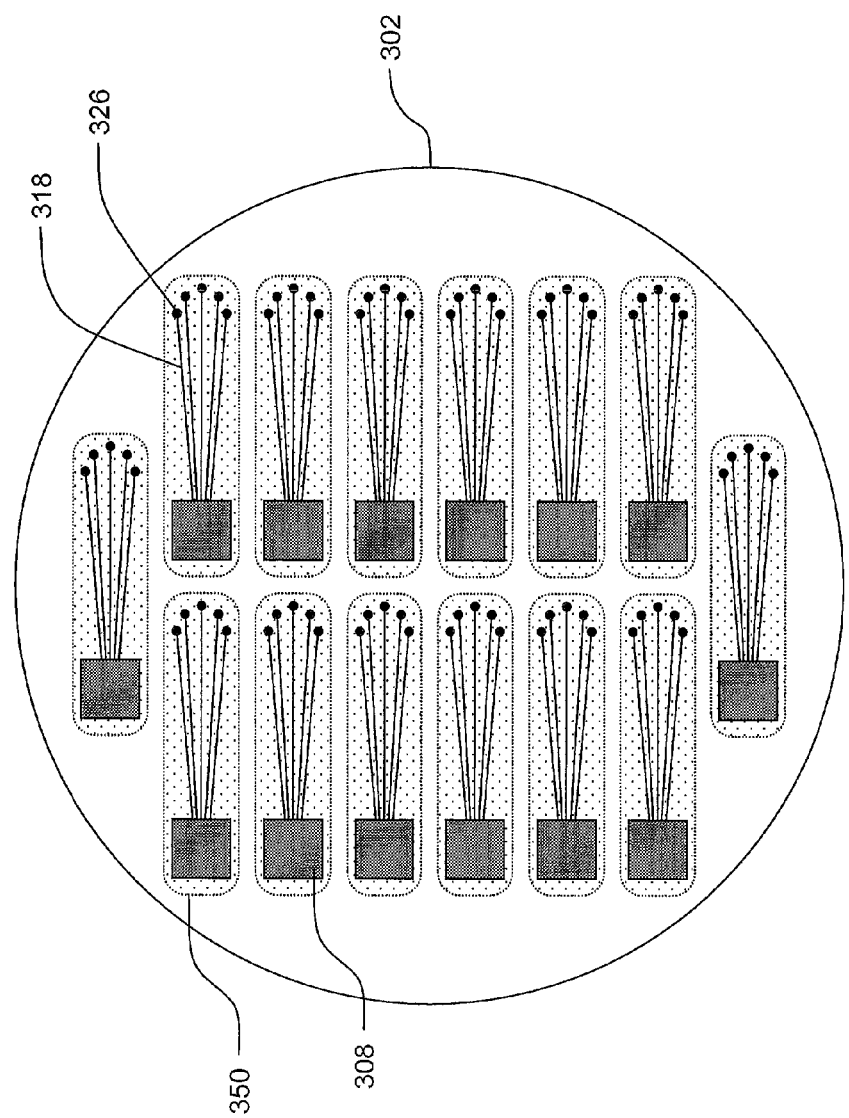
FIG. 3 is a plan view of an example of a substrate in which a plurality of packaged electronic devices is being fabricated.

FIG. 3 is a planar view of a wafer 302 as an example of a substrate on which a plurality of flexible circuit structures 350 may be fabricated. The respective footprints of the flexible circuit structures 350 are indicated by dotted lines. Fourteen flexible circuit structures 350 are illustrated by example. The number of flexible circuit structures 350 that may be built on the surface of the wafer 302 may be more or less than fourteen, depending on the size of the wafer 302 and the size of the flexible circuit structures 350. Die areas 308 depicted in FIG. 3 represent the footprint of the die circuitries and accompanying electrical contacts, terminations of vertical interconnects, or the like as described above in conjunction with the implementations illustrated in FIGS. 1A-2J. A plurality of electrical conductors or traces 318 are embedded within the insulating structural material utilized in building the flexible circuit structures 350 as described above, and are sufficiently isolated from each other so as to avoid cross-talk. For each flexible circuit structure 350, five electrical conductors 318 are illustrated by example—more or less may be provided. The electrical conductors 318 provide signal communication between the electrical contacts of the die areas 308 and corresponding electrode sites or bond pads 326 formed remotely from the die areas 308. Depending on the design and purpose of the electronic devices being fabricated, the electrode sites or bond pads 326 may be physically connected or wirelessly interfaced with other electronic devices. As but one non-limiting example, the electrode sites or bond pads 326 may communicate with an electrode array utilized for in vivo/in vitro neurostimulation. FIG. 3 also illustrates that the lengths of the flexible circuit structures 350 generally in the direction of the electrical conductors 318 may be large relative to their widths. Accordingly, the flexible circuit structures 350 may serve as flexible ribbon cables in various implementations.

Referring to FIG. 4, it is possible to include multiple die on a single packaged electronic device 450. In the illustrated example, a planar (i.e., side by side) arrangement of two discrete die 422 and 432 are bonded to a first structural layer 406 by means of attachment layers 414 and 434 and electrically connected to the electrical conductors 410 by means of respective through-wafer-interconnects 428 and 438 between die circuitry 424 and 434 and the electrical conductors 410. The second die 432 communicates with one or more electrical conductors 410 via one or more interconnects 438 positioned at intermediate locations of the electrical conductors 410 between the first ends and the second ends of the electrical conductors 410. This may be accomplished by using the process steps described in FIGS. 2A-2J where more than one die are aligned and attached in the steps associated with FIG. 2E. A second structural layer 412 completes the encapsulation in the manner described above, and a barrier film or coating 418 may optionally be provided. The die 422 and 432 may communicate with one another or with any remotely situated device (not shown) as described above by means of the electrical conductors 410 and corresponding openings 416. The electrical conductors 410 may extend along a flexible cable portion 420 in a longitudinal direction (i.e., the direction generally from the die 422 and 432 to the openings 416). While FIG. 4 illustrates two discrete die 422 and 432, it is understood that any advantageous number of die can be included in the packaged electronic device 450. While FIG. 4 illustrates a planar arrangement of multiple die along the longitudinal direction, multiple die may also be arranged along the orthogonal lateral direction (i.e., the direction into the drawing sheet of FIG. 4), or in a two-dimensional array along both the longitudinal and lateral directions.

FIG. 5 illustrates another example of providing multiple die in a single packaged electronic device 550. In the illustrated example, a vertical arrangement of three discrete die 502, 522, 532 and respective die circuitry 504, 526, 536 are provided. Each successive die in the vertical stack is attached to the die immediately below it. The first die 502 is attached to the first structural layer 506 and the electrical conductors 510 by means of an attachment layer 514, and the die circuitry 504 on this first die 502 is in electrical contact with the electrical conductors 510 by means of through-wafer interconnects 508 as described above. Additional die are "stacked" onto this first die 502 prior to the deposition of a second structural layer 512. In process steps similar to those described above, a second attachment layer 524 may be deposited on the first die 502 and a second die 522 aligned and attached to the first die 502. Through-wafer-interconnects 528 in the second die 522 enable signal communication between the die circuitry 526 on the second die 522 and the die circuitry 504 on the first die 502. Similarly, a third attachment layer 534 may be deposited on the second die 522, a third die 532 aligned and attached to the second die 522, and through-wafer-interconnects 538 in the third die 532 manufactured to enable signal communication between the die circuitry 536 on the third die 532 and the die circuitry 526 on the second die 522. Finally the second structural layer 512 is deposited and processing continues as described in FIGS. 2H-2J, with the optional addition of a barrier film 518. As in other implementations described above, the electrical conductors 510 may be interfaced with a remote device via openings 516, and may be extended along a flexible cable portion 520. While three die 502, 522, 532 are illustrated in FIG. 5, the process could be limited to two die or continued with additional stacked die.

The inclusion of multiple die on a single packaged electronic device offers several advantages. One advantage is that each die may be configured to handle different functions to improve the performance and/or efficiency of the device. For example, one die might contain digital circuitry while another die might contain analog circuitry allowing for each type of circuitry to be fabricated by a different targeted process. Another advantage is that redundancy could be built into a critical device where two or more identical die are included that could be enabled/disabled remotely in the case that one of the die failed for any reason during the lifetime of the device. Yet another advantage is that additional circuitry can be included without increasing individual die size which could lead to lower die yield and thus increased cost.

Multiple die may be included on a single packaged electronic device not only in a panar arrangement as illustrated in FIG. 4, but also in a vertical arrangement as illustrated in FIG. 5. The three-dimensional (3D) integration or "chip stacking" shown in FIG. 5 represents an improved method for vertically aligning and bonding multiple dies. The semiconductor industry is employing 3D integration technologies to achieve higher performance (faster signal processing, lower power consumption), smaller device size and much higher I/O count, all of which may be facilitated through the use of through-wafer interconnects. Conventionally, microelectronics are fabricated in a traditional 2D surface-mount or flip-chip approach. Device size is dictated by the number and physical dimensions of the IC chips used, and is also impacted by the discrete passive surface mount components provided. However, by stacking and interconnecting the various dies, one can expect to get a dramatic decrease in the size (footprint area) and weight of the electronics, an important consideration for implantable neural prostheses and other electronic devices contemplated by the present teachings Vertical interconnects allow the opportunity to bond an active device to a passive component layer containing resistors, capacitors, inductances or power ground planes with a high density of interconnects. The possibility of integrating passive components such as capacitors onto the stacked device and moving them off the flex substrate will reduce device size further and minimize reliability concerns with these surface mounted devices.

FIG. 6 illustrates a packaged electronic device 650 that include multiple layers or elevations of electrical conductors 610, 630, 640. In some implementations, some of the electrical conductors 610, 630, 640 may be arranged vertically while others are side by side in the lateral direction (i.e., into the drawing sheet of FIG. 6). In other implementations, all of the electrical conductors 610, 630, 640 may be arranged vertically. Each layer of electrical conductor(s) 610, 630, 640 is sandwiched between adjacent structural layers 606, 612, 622, 632 and consequently spaced and electrically isolated from the other electrical conductors 610, 630, 640. A single die 602 and associated die circuitry 604 may be provided and may be bonded to the internal structural layer 622 by an attachment layer 614 as described above. The die circuitry 604 may communicate with respective electrical conductors 610, 630, 640 via corresponding interconnects 638, 628, 608. Alternatively, multiple die may be provided as described above in conjunction with FIGS. 4 and 5, with selected die circuitries communicating with each other or with selected electrical conductors 610, 630, 640 or layers of electrical conductors 610, 630, 640 (i.e., one of more electrical conductors 610, 630, 640 of the same level or elevation). The structural layers 606, 612, 622, 632 may be patterned so as to provide vias in appropriate locations whereby each electrical conductor provides signal communication between the die circuitry 604 and at least one electrode site 616, 626, 636 (which may be placed in signal communication with another device external to or remote from the die circuitry). Alternately, the internal structural layers 612, 622 may be patterned so as to provide signal communication between electrical conductors 610, 630, 640 on different layers. While three layers of electrical conductors 610, 630, 640 are illustrated in FIG. 6, it is understood that this is not limiting and that two layers of electrical conductors or four or more layers of electrical conductors may be included. Encapsulation is completed by a second structural layer 632 with or without an additional barrier layer 618, as described above. The electrical conductors 610, 630, 640 may be extended along a flexible cable portion 620 as described above.

FIG. 7 illustrates another example of a package electronic device 750. A die 702 includes die circuitry 704 and is bonded to a flexible circuit structure by an intermediate structural layer (or attachment layer) 714. The flexible circuit structure includes a first structural layer 706 on or in which electrical conductors 710 are disposed. The die circuitry 704 communicates with the electrical conductors 710 via vertical interconnects 708 that extend through the die 702 and the intermediate structural layer 714. The electrical conductors may extend along a flexible cable portion 720. The die 702 and the electrical conductors 710 are encapsulated by the first structural layer 706 and a second structural layer 712, and an additional barrier layer 718 may optionally be provided. In this example, openings 716 defining respective exposed areas on the electrical conductors 710 are patterned in the first structural layer 706 rather than the second structural layer 712 as was described in FIGS. 2A-2J. This results in the openings 716 and the die 702 being on the opposite sides of the electrical conductors 710, which may be advantageous in certain implementations. The process flow required to produce this implementation is similar to the process flow described above, the modifications being readily apparent to those skilled in the art in view of the foregoing disclosure. Additionally (not shown), openings to the electrical conductors 710 may be patterned in both the first structural layer 706 and the second structural layer 712, resulting in contact to these electrical conductors from both sides of the packaged electronic device 750.

As described above, barrier coatings such as the barrier coatings 118, 226, 418, 518, 618 and 718 shown in the Figures may be provided to impart to or enhance hermetic, insulating and/or biocompatible properties of the substrates to which the barrier coatings are applied, such as the above-described flexible structural layers that typically are polymers such as, for example, chemically cross-linked polymers such as polyimides. The composition of the barrier coating and/or the manner in which it is surface-treated may determine whether the barrier coating is biocompatible in a given implanted application (e.g., a particular in vivo site). For a given application, biocompatibility may be indicated by whether the barrier coating is hydrophilic or hydrophobic, or has an affinity or non-affinity for certain specific biomaterials (e.g., biomolecules, blood, tissues, tissue fluids, etc.), or is adsorptive or non-adsorptive of certain specific biomaterials. An adsorbed protein layer mediates the subsequent biochemical and cellular events at the surface of the implant, which may determine the biocompatibility of the implant. For example, when considering compatibility with blood, the amount and type of protein that adsorbs onto the surface of an implanted device may either trigger or prevent coagulation and/or thrombosis. Three of the most abundant proteins found in blood plasma are fibrinogen, albumin and immunoglobin G (IgG). Albumin adsorbed onto a surface has been observed to reduce subsequent platelet deposition. Brash, J. L. and Uniyal, S., "Dependence of albumin-fibrogen simple and competitive adsorption on surface properties of biomaterials," *Journal of Polymer Science* 1979 (66), which is incorporated by reference herein in its entirety. On the other hand, fibrinogen is thought to play a central role in blood coagulation and support platelet adhesion and aggregation through binding to glycoprotein (GP) IIb-IIIa integrin receptors. Slack, S. M. and Horbett, T. A., "The Vroman Effect: A Critical Review," ACS Symposium Series No. 602, American Chemical Society, 1995, which is incorporated by reference herein in its entirety. Therefore, surfaces that have a high affinity for albumin may be more biocompatible than surfaces with a high affinity for fibrinogen. As another example, cell adhesion may be greater on hydrophilic substrates than on hydrophobic substrates. Van Wadrem, A. H. Hogt, J. Bengeling, J. Feigen, A. Bantjes, J. P. Detmers, and W. G. Van Akan, Biomaterials, 8, (1987), 323, which is incorporated by reference herein in its entirety.

In some implementations, the barrier coating is a gas plasma-deposited polymer. Gas plasma deposited polymers may be modified with various gas plasma treatments using oxygen or nitrogen-containing gases to result in surfaces with desired terminating functional groups. The surface of the gas plasma polymer may be modified with different functionalities and surface energies to provide a desired adsorption or non-adsorption characteristic for biomolecules. W. R. Gombatz, and A. S. Hoffman, CRC Critical Reviews in Biocompatability, 4, (1987), 1, which is incorporated by reference herein in its entirety.

As described above, polyimide is an example of a substrate to which the barrier coating may be applied. The polyimide layer may be formed in accordance with a number of techniques. For example, in one implementation, a polyimide precursor may be applied to a substrate via a suitable method such as, for example, spin-coating or spray-coating. Typically, the precursor is applied in the form of a solution and thereafter cured, after which the polyimide will have a desired thickness. One example of a suitable polyimide precursor contains pendant photoreactive side groups. Upon exposure to radiation (e.g., ultraviolet (UV) radiation), the photoreactive endgroups undergo a free radical polymerization to form a crosslinked polyimide precursor. Such a process typically results in a solubility difference between the exposed and unexposed regions of the coating. The unexposed regions can be removed by employing a suitable technique, such as, for example, dissolution in a suitable solvent (e.g., developer). The remaining crosslinked intermediates may be subsequently converted to fully imidized polyimides by thermal cure. The cured polyimide may be an aromatic polyimide. In some implementations, the polyimide layer includes from about 50 to about 60 percent carbon and from about 10 to about 40 percent silicon.

A number of methods may be utilized to form the barrier coating on the polyimide or other type of substrate. Examples of techniques include, without limitation, plasma enhanced chemical vapor deposition (PECVD), chemical vapor deposition (CVD), sputtering, evaporation, and other deposition techniques such as plating, dip coating, flow coating, spray coating, or spin coating. In some implementations, the coating is formed out of a material using precursors from, for example, silanes, siloxanes (e.g., polysiloxanes), silazanes, hydrocarbons, various metal organics, titanates, or metal alkoxides, as well as combinations of any of the above. Examples of precursors that may be employed include, without limitation, tetramethylsilane, trimethylsilane, tetramethoxysilane, hexamethyl disilane, hexamethyl disiloxane, hexamethyl disilazane, methane, ethane, ethylene, tetraalkoxy titanates, etc, as well as combinations thereof. In general, oxides, carbides, and nitrides using a number of metal organic precursors can be employed, along with oxygen, hydrocarbon, and nitrogen-containing gases respectively. The precursor may have low silicon content.

In some implementations, a PECVD process may be employed utilizing any of the above-mentioned precursors (typically in the form of feed gas) introduced with or without argon or other inert gas and energizing these materials into a plasma by direct current, radio frequency, microwave, enhanced plasmas or by hollow cathode magnetron energy sources. The energized precursor (with or without energized argon or other inert gas) is promoted into an excited state, producing at least one of ionic fragments, free radicals, atoms, molecules, and mixtures thereof, in an excited state which bombard and reconstruct on a base layer to produce a coating. In specific implementations, an alternating magnetic field is employed to excite any of the precursors present in a reactor (e.g., a vacuum chamber). Among other factors, the precursor and the process conditions are believed to influence the specific compositions and properties of the coatings. The plasma enhanced chemical vapor deposition (PECVD) may be carried out at or slightly above room temperature. However, it will be appreciated that other temperatures can be employed. For example, in one implementation, a higher substrate temperature in the range from about 300 to about 400° C. may be used for deposition to attain specific properties such as lower incorporation of hydrogen in the coatings for potentially improved mechanical and temperature stability. Various pressures may be employed. For example, in some implementations, the pressure may range from about 10 mTorr to about 1 atm (760 Torr). In a specific implementation, a pressure of 50 mTorr is utilized.

Some examples of chemically crosslinked coatings suitable for implementations described herein include amorphous Si—C—H coatings and amorphous silicon oxycarbide (Si—O—C—H). The Si—C—H coating may be an amorphous DLC material. Polymeric layers may include a chemically crosslinked material comprising elements selected from the group consisting of (1) M, O, C, H, and N, wherein M is a metal selected from the group consisting of silicon, titanium, tantalum, germanium, boron, zirconium, aluminum, hafnium and yttrium; (2) M, O, H, and N, wherein M is defined above; (3) C; (4) O, C, H, and N; (5) M or C, and one of O, H, or N; and (6) C, H and O, Such coatings may be deposited on a substrate using a variety of techniques, such as those described above.

Thus, the chemically crosslinked material may comprise a number of combination of elements. In some implementations, M is silicon which may be present in combination with any one or more of the three elements: O, H, and N. In some implementations, the chemically crosslinked material is applied by a PECVD and results in a crosslinked, amorphous matrix. In one example, the material comprises from about 5 to about 30 percent by weight silicon, about 10 to about 60 percent carbon, about 10 to about 60 percent hydrogen and trace amounts of oxygen, i.e., typically less than 3 percent. In another example, the chemically crosslinked material comprises from about 30 to about 60 percent carbon and from about 10 to about 40 percent silicon. The coating may have a number of various thicknesses. For example, the coating may have a thickness which is at least a fraction of a monolayer thick. In this context, the term "fraction" of a monolayer refers to at least about 50 percent by area of the patterned surface regions where the coating is intended to be deposited. In one example, the coating has a thickness ranging from about 200 nanometers to about 400 nanometers.

The coating may have a surface that is terminated with an electrophilic or nucleophilic functional group. Either the electrophilic or the nucleophilic functional group may be considered to be biocompatible depending on the site or environment of the implantation and/or the nature (purpose, function, operation, etc.) of the device being implanted.

Thus, after forming a coating on the substrate or base layer, the surface of the coating may be modified using various techniques. For example, in some implementations, an electronegative post-treatment of a surface of a coating may be a plasma treatment using various substances such as, without limitation, oxygen, ozone, water vapor, nitrogen oxide, fluorine, or fluorine gases/gas mixtures including fluorocarbons, fluorosilanes, or any other gas that would result in functionalities having a negative polarity associated with them. The electronegative post-treatment results in the surface being terminated with at least one nucleophilic functional group. The nucleophilic functional group may include carbon, silicon, halogens, oxygen, hydrogen, nitrogen, sulfur and/or phosphorus. Another implementation encompasses a chemical post-treatment of the surface utilizing, as an example, perfluorinated polyethers, silanes terminated with electronegative functionalitites, or similar compounds such as those typically used for self assembled monolayers (SAMs).

Any number of nucleophilic functional groups may be utilized. In the present context, the term "nucleophilic functional group" may be defined as a group capable of donating a pair of electrons to an electrophile. In various implementations, the nucleophilic functional group comprises one or more elements selected from the group consisting of carbon, silicon, halogens, oxygen, hydrogen, nitrogen, sulfur, and phosphorus. Examples of electronegative surface sites include, without limitation, oxygenated or fluorinated functional groups or any other groups displaying an electronegative polarity. Typically, the surface of the coating material having nucleophilic functional groups attached thereto is advantageous in that a build up of a negative polarity on the surface results. Accordingly, materials having a negative charge (e.g., biomolecules) are repelled, and thus the surface is non-adsorbing.

Alternatively, electropositive post treatment of the surface of the coating may be carried out using a number of techniques including, but not limited to, a plasma treatment employing hydrogen. Chemical post-treatments to obtain electropositive polarities may also be utilized if desired. The electropositive post-treatment results in the surface of the coating being terminated with at least one electrophilic functional group. The electrophilic functional group can include carbon, hydrogen, nitrogen and silicon. Biomolecules may be adsorbed to electrophilic functional group, including DNA, nucleic acids, proteins, enzymes, cells, viruses, and combinations thereof.

Any number of electrophilic functional groups may be utilized. In the present context, the term "electrophilic functional group" may be defined as a functional group which has an electropositive polarity. The electrophilic functional group may comprise one or more elements selected from the group consisting of carbon, hydrogen, nitrogen and silicon. Examples of electrophilic functional groups include, without limitation, any group capable of imparting a positive polarity to the coating material including, for example, hydrogen-terminations, alkyl groups, and quarternary ammonium group molecules.

Advantageously, a number of materials may be adsorbed to the electrophilic functional group. In the present context, the term "adsorbed" may be defined as increased adhesion of dissolved materials (e.g., biomolecules) to the surface of the chemically crosslinked material. The term "non-adsorbed" may be defined as decreased adhesion of dissolved materials (e.g., biomolecules) to the surface of the chemically crosslinked material. Not intending to be bound by theory, it is believed that a positive polarity is present on the coating surface which electrostatically attracts and adsorbs negatively charged groups. Examples of negatively charged groups include, without limitation, electron-rich biomolecules or polyanions such as, for example, DNA, nucleic acids, proteins, enzymes, cells, viruses, and combinations thereof. Examples of these materials are set forth in U.S. Pat. No. 5,968,745 to Thorp et al., which is incorporated by reference herein in its entirety.

In some implementations, various portions of the surface of the coating may be terminated with at least one electrophilic functional group while other surface portions may be terminated with at least one nucleophilic functional group. In some implementations, the portion of the surface of the coating terminated with at least one electrophilic functional group and the portion of the surface of the coating terminated with at least one nucleophilic functional group may be adjacent to one another. This configuration may be desirable for some implementations because it allows for the selective formation of adsorbing and non-adsorbing regions on the substrate. A method of forming such surfaces is described in detail below.

In one non-limiting example of a method for chemically modifying the surface of a substrate or base layer such as the structural layers described above, a composition comprising at least one precursor is exposed to an energy source to form an energized precursor. The energized precursor is promoted into an excited state to produce ionic materials. The ionic materials are deposited on a base layer such that the ionic materials form a coating thereon. As described above, the coating may comprise a chemically crosslinked material comprising elements selected from the group consisting of (1) M, O, C, H, and N, wherein M is a metal selected from the group consisting of silicon, titanium, tantalum, germanium, boron, zirconium, aluminum, hafnium and yttrium; (2) M, O, H, and N, wherein M is defined above; (3) C; (4) O, C, H, and N; and (5) M or C, and one of O, H, or N. The chemically crosslinked material may be treated such that the material is terminated with at least one electrophilic or nucleophilic functional group. As an example, a gas plasma treatment using reactive but non-polymerizing gases such as oxygen, nitrogen or ammonia may be used to modify the surface free energy or charge potential of the gas plasma coating. For example, when oxygen is used for post-treatment, the resulting surface has oxygen containing functional groups such as —COOH and —OH and is hydrophilic. The treatment also imparts a negative charge to the surface because oxygen containing functionalities are negatively charged. For biocompatibility, the surface charge may serve as an advantage to repel platelets, cells and proteins which tend to have a net negative charge. As another example, when nitrogen or ammonia are utilized for the post-treatment, the coating can be terminated using amine functional groups, which also results in a hydrophilic surface. Thus, the type of post-treatment can achieve the properties desired for a particular application. For example, nitrogen or ammonia gas plasma treatments on certain conventional polymers have shown improved biocompatibility. C. P. Sharma, T. Chandy, and M. C. Sunny, Journal of Biomaterials Application, 1, (1987), 533; C. P. Sharma, and P. R. Hari, Journal of Biomaterials Application, 6, (1991), 72; C. P. Sharma, G. Jayashree, and P. P. Najeeb, Journal of Biomaterials Application, 2, 1987, 205, all of which are respectively incorporated by reference herein in their entireties.

The barrier coating may also be applied to the substrate or base layer to form an implantable electrode. As an example, an electrically conducting intermediate layer may be present between the coating and the base layer. The intermediate layer may comprise one or more electrically conducting metals or metal alloys such as, without limitation, platinum, gold, and/or palladium, as well as one or more electrically conducting doped and undoped oxides such as, without limitation, indium-doped tin oxide (ITO), tin oxide, titanium oxide, manganese oxide, zinc oxide, and lead oxide, as well as materials including, without limitation, gold, platinum, palladium, carbon, silicon, germanium, cadmium sulfide, titanium dioxide, and gallium arsenide. Combinations and alloys of the above may also be employed. In one aspect, the intermediate layer is typically utilized to form an electrode whose active electrode opening is defined by an opening in the coating while the connection leads that provide electrical contacts to the working electrode are encapsulated by the coating. In another aspect, the coating is capable of providing a non-adsorbing surface for various materials (e.g., large biomolecules), which otherwise may possibly be lost for electrochemical detection due to adsorption to surfaces surrounding the electrode openings.

The patterning of the intermediate layer may be carried out by employing a number of techniques such as, for example, wet etching, lift off, shadow masking, screen printing, and the like. These procedures are illustrated in greater detail herein. The intermediate layer may be employed in such a manner to form a number of various patterns in combination with the coating and the base layer. For example, the coating may be selectively removed such that openings are formed therein to allow the intermediate layer to be exposed. In another example, the intermediate layer and the coating present thereon are removed in a manner to expose the base layer underneath the intermediate layer and coating layer. Alternatively, the intermediate layer and the coating may be present such that the base layer is completely encapsulated.

As an example of depositing the coating, the coating may be deposited utilizing a PECVD process by employing the following parameters and precursor gas. First, an argon and oxygen plasma treatment may be utilized to clean the substrate surface prior to the deposition of the passivation layer. This step is intended to remove adsorbed organic impurities from the surface to allow for good adhesion of the coating. The following conditions may be employed: gas mixture: 50 percent argon and 50 percent oxygen; processing pressure: 50 mTorr; bias voltage: −250 V; processing time: 10 min. Next, a passivation layer may be deposited on the substrate employing the following conditions: active precursor: tetra methyl silane $Si(CH_3)_4$, 3 percent in argon; processing pressure: 50 mTorr; bias voltage: −250 V. This may result in a coating thickness of approximately 300 nm. Next, plasma surface activation may be performed as the terminating step. It should be appreciated, however, that this step is optional, depending on the surface adsorption properties desired. Thus, this step is non-limiting. In an attempt to minimize or avoid non-specific adsorption of nucleic acids and proteins, an oxygen plasma treatment is performed to terminate the coating surface with functional groups having negative polarities. Nucleic acids being polyanions are believed to not adsorb to these negative functionalities, which may be highly advantageous in various implementations. The following processing conditions may be employed: processing gas: 100 percent oxygen; processing pressure: 50 mTorr; bias voltage: −250 V; processing time: 1 min.

As examples of patterning an intermediate layer, various techniques may be utilized. In the case of a wet etching technique, a photoresist may be deposited and patterned as an etch mask on top of a blanket coated intermediate layer. The intermediate layer may be selectively etched by bringing exposed areas of intermediate layer in contact with a chemical etchant. The etch mask may then be removed. In the case of a lift-off technique, a photoresist may be deposited and patterned on top of the surface of the base layer. Material for the intermediate layer may be vacuum-deposited on top of base layer. The photoresist may then be removed, thereby lifting off portions of the intermediate layer that were deposited on top of photoresist and leaving the patterned intermediate layer behind. In the case of a shadow masking technique, intermediate layer may be patterned during the deposition of the intermediate layer by bringing a foil containing defined openings in direct contact with the surface of the base layer. In such a way, the material for the intermediate layer is only deposited on the base layer at the locations of the foil openings. In the case of a screen printing technique, paste containing material for intermediate layer may be screen printed through a screen or stencil resembling desired pattern of the intermediate layer on top of the base layer.

As examples of patterning a PECVD coating, various techniques may be utilized. In the case of a lift-off technique, a photoresist may be deposited and patterned on top of the surface of the base layer. The PECVD coating may be vacuum deposited on top of the base layer. The photoresist may then be removed, thereby lifting off portions of PECVD coating that were deposited on top of photoresist and leaving patterned PECVD coating behind. In the case of shadow masking, the PECVD coating may be patterned during its deposition by bringing a foil containing defined openings in direct contact with the surface of the base layer, the intermediate layer, or both, in such a way that the PECVD coating is only deposited at the locations of the foil openings. In the case of plasma etching, PECVD coating may be patterned by etching selected regions of the coating after deposition. In this dry etching mode, selected regions of the coating may be protected from the etching environment either by applying photoresist or covering these regions with a shadow mask. The etching environment may comprise reactive gas plasma using gases such as, without limitation, oxygen, a fluorine containing gas such as carbon tetrafluoride or sulphur hexafluoride, or mixtures of oxygen and the fluorine containing gas. The PECVD coating can also be selectively removed by ion milling or sputtering using an inert gas plasma or ion beam source.

In addition to in vitro and in vivo applications, the packaged electronic device may be configured for use as a sensor, a diagnostic tool, or other type of instrument in more traditional operating environments. For example, the device may be utilized in a detection system such as, without limitation, an electrochemical detection system, a chemical detection system, an optical detection system, or a microfluidic system. As an example, the microfluidic system may include at least one biofouling surface.

Additional Embodiments

In addition to methods described above, the present disclosure provides the following methods:

1. A method for fabricating a packaged electronic device, the method comprising: forming a plurality of electrical conductors on a first structural layer; depositing an attachment layer on the electrical conductors and the first structural layer; placing a die including die circuitry on the attachment layer to bond the die to the first structural layer; forming a plurality of interconnects extending from the die circuitry, through the die, through the attachment layer, and into contact with respective electrical conductors; depositing a second structural layer on the die and exposed portions of the electrical conductors, wherein the first structural layer and the second structural layer encapsulate the die, the die circuitry and the electrical conductors; and forming a plurality of openings through at least one of the first structural layer and the second structural layer to expose respective areas of the electrical conductors.

2. The method of embodiment 1, comprising forming through-holes in the die prior to placing the die on the attachment layer, wherein placing the die comprises aligning the through-holes with respective electrical conductors, and further comprising removing exposed portions of the attachment layer to extend the through-holes through the attachment layer to the respective electrical conductors, wherein forming the interconnects comprises depositing interconnect material in the through-holes.

3. The method of embodiment 1, comprising forming through-holes through the die and the attachment layer, wherein forming the interconnects comprises depositing interconnect material in the through-holes.

4. The method of embodiment 1, wherein the die has a thickness ranging from 10 µm to 50 µm.

5. The method of embodiment 1, wherein the attachment layer has a thickness ranging from 0.5 µm to 5 µm.

6. The method of embodiment 1, wherein the first structural layer has a thickness ranging from 2 µm to 100 µm.

7. The method of embodiment 1, wherein the second structural layer has a thickness ranging from 2 µm to 100 µm.

8. The method of embodiment 1, wherein the attachment layer includes a polymer selected from the group consisting of polyimide, copolymers of polyimide, blends of polyimide, polyparaxylylene, liquid-crystal polymers, and benzocyclobutene.

9. The method of embodiment 1, wherein the first structural layer includes a polymer selected from the group consisting of polyimide, copolymers of polyimide, blends of polyimide, polyparaxylylene, liquid-crystal polymers, and benzocyclobutene.

10. The method of embodiment 1, wherein the second structural layer includes a polymer selected from the group consisting of polyimide, copolymers of polyimide, blends of polyimide, polyparaxylylene, liquid-crystal polymers, and benzocyclobutene.

11. The method of embodiment 1, wherein the first structural layer, the second structural layer and the attachment layer each include a polymer selected from the group consisting of polyimide, copolymers of polyimide, blends of polyimide, polyparaxylylene, liquid-crystal polymers, and benzocyclobutene.

12. The method of embodiment 1, comprising depositing a barrier film on at least one of the first structural layer and the second structural layer.

13. The method of embodiment 12, wherein the barrier film comprises elements selected from the group consisting of (1) M, O, C, H, and N, wherein M is a metal selected from the group consisting of silicon, titanium, tantalum, germanium, boron, zirconium, aluminum, hafnium and yttrium; (2) M, O, H, and N; (3) C; (4) O, C, H, and N; and (5) M or C, and one of O, H, or N.

14. The method of embodiment 13, wherein the barrier film comprises diamond-like carbon.

15. The method embodiment 12, comprising terminating the barrier film with at least one of an electrophilic functional group or a nucleophilic functional group.

16. The method of embodiment 12, comprising modifying a surface of the barrier film such that the barrier film is hydrophilic, hydrophobic, adsorptive of a desired biomaterial, or non-adsorptive of a desired biomaterial.

17. The method of embodiment 1, wherein the die is a first die, and further comprising placing a second die on the attachment layer or an additional attachment layer in a planar arrangement with the first die, and forming a plurality of interconnects extending from die circuitry of the second die, through the second die, through the attachment layer or additional attachment layer, and into contact with respective electrical conductors, wherein the second structural layer is deposited on the second die and both the first die and the second die are encapsulated by the first structural layer and the second structural layer.

18. The method of embodiment 1, wherein the die is a first die and the attachment layer bonding the first die to the first structural layer is a first attachment layer, and further comprising depositing a second attachment layer to the first die, placing a second die on the second attachment layer to bond the second die to the first die, and forming one or more interconnects extending from die circuitry of the second die, through the second die, and in electrical contact with the die circuitry of the first die, wherein the second structural layer is deposited on the second die and both the first die and the second die are encapsulated by the first structural layer and the second structural layer.

19. The method of embodiment 1, wherein forming the plurality of electrical conductors comprises forming a plurality of layers of electrical conductors, and further comprising depositing one or more intermediate flexible structural layers such that each intermediate flexible structural layer is interposed between two neighboring layers of electrical conductors.

20. The method of embodiment 1, wherein the plurality of openings is formed in the second structural layer and is on the same side of the electrical conductors as the die.

21. The method of embodiment 1, wherein the plurality of openings is formed in the first structural layer and is on an opposite side of the electrical conductors as the die.

22. The method of embodiment 1, wherein one or more of the openings are formed in the first structural layer and the other opening or openings are formed in the second structural layer, such that one or more openings are on the same side of the electrical conductors as the die and one or more openings are on an opposite side of the electrical conductors as the die.

One or more aspects, features, components, method steps and the like disclosed herein may be applicable to those disclosed in U.S. patent application Ser. No. 12/333,448, filed Dec. 12, 2008, titled, "ELECTRONIC DEVICES INCLUDING FLEXIBLE ELECTRICAL CIRCUITS AND RELATED METHODS," which is incorporated by reference herein in its entirety. Implementations utilizing or combining subject matter specifically disclosed herein and in U.S. patent application Ser. No. 12/333,448 are encompassed by the present disclosure.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for fabricating a packaged electronic device, the method comprising:
   forming a plurality of electrical conductors on a first structural layer;
   depositing an attachment layer on the electrical conductors and the first structural layer;
   placing a die including die circuitry on the attachment layer to bond the die to the first structural layer;
   forming a plurality of interconnects extending from the die circuitry, through the die, through the attachment layer, and into contact with respective electrical conductors;
   depositing a second structural layer on the die and exposed portions of the electrical conductors, wherein the first structural layer and the second structural layer encapsulate the die, the die circuitry and the electrical conductors; and
   forming a plurality of openings through at least one of the first structural layer and the second structural layer to expose respective areas of the electrical conductors.

2. The method of claim 1, comprising forming through-holes in the die prior to placing the die on the attachment layer, wherein placing the die comprises aligning the through-holes with respective electrical conductors, and further comprising removing exposed portions of the attachment layer to extend the through-holes through the attachment layer to the respective electrical conductors, wherein forming the interconnects comprises depositing interconnect material in the through-holes.

3. The method of claim 1, comprising forming through-holes through the die and the attachment layer, wherein forming the interconnects comprises depositing interconnect material in the through-holes.

4. The method of claim 1, wherein the die has a thickness ranging from 10 μm to 50 μm.

5. The method of claim 1, wherein the attachment layer has a thickness ranging from 0.5 μm to 5 μm.

6. The method of claim 1, wherein the first structural layer has a thickness ranging from 2 μm to 100 μm.

7. The method of claim 1, wherein the second structural layer has a thickness ranging from 2 μm to 100 μm.

8. The method of claim 1, wherein the attachment layer includes a polymer selected from the group consisting of polyimide, copolymers of polyimide, blends of polyimide, polyparaxylylene, liquid-crystal polymers, and benzocyclobutene.

9. The method of claim 1, wherein the first structural layer includes a polymer selected from the group consisting of polyimide, copolymers of polyimide, blends of polyimide, polyparaxylylene, liquid-crystal polymers, and benzocyclobutene.

10. The method of claim 1, wherein the second structural layer includes a polymer selected from the group consisting of polyimide, copolymers of polyimide, blends of polyimide, polyparaxylylene, liquid-crystal polymers, and benzocyclobutene.

11. The method of claim 1, wherein the first structural layer, the second structural layer and the attachment layer each include a polymer selected from the group consisting of polyimide, copolymers of polyimide, blends of polyimide, polyparaxylylene, liquid-crystal polymers, and benzocyclobutene.

12. The method of claim 1, comprising depositing a barrier film on at least one of the first structural layer and the second structural layer.

13. The method of claim 12, wherein the barrier film comprises elements selected from the group consisting of (1) M, 0, C, H, and N, wherein M is a metal selected from the group consisting of silicon, titanium, tantalum, germanium, boron, zirconium, aluminum, hafnium and yttrium; (2) M, 0, H, and N; (3) C; (4) 0, C, H, and N; and (5) M or C, and one of 0, H, or N.

14. The method of claim 12, wherein the barrier film comprises diamond-like carbon.

15. The method claim 12, comprising terminating the barrier film with at least one of an electrophilic functional group or a nucleophilic functional group.

16. The method of claim 12, comprising modifying a surface of the barrier film such that the barrier film is hydrophilic, hydrophobic, adsorptive of a desired biomaterial, or non-adsorptive of a desired biomaterial.

17. The method of claim 1, wherein the die is a first die, and further comprising placing a second die on the attachment layer or an additional attachment layer in a planar arrangement with the first die, and forming a plurality of interconnects extending from die circuitry of the second die, through the second die, through the attachment layer or additional attachment layer, and into contact with respective electrical conductors, wherein the second structural layer is deposited on the second die and both the first die and the second die are encapsulated by the first structural layer and the second structural layer.

18. The method of claim 1, wherein the die is a first die and the attachment layer bonding the first die to the first structural layer is a first attachment layer, and further comprising depositing a second attachment layer to the first die, placing a second die on the second attachment layer to bond the second die to the first die, and forming one or more interconnects extending from die circuitry of the second die, through the second die, and in electrical contact with the die circuitry of the first die, wherein the second structural layer is deposited on the second die and both the first die and the second die are encapsulated by the first structural layer and the second structural layer.

19. The method of claim 1, wherein forming the plurality of electrical conductors comprises forming a plurality of layers of electrical conductors, and further comprising depositing one or more intermediate flexible structural layers such that each intermediate flexible structural layer is interposed between two neighboring layers of electrical conductors.

20. The method of claim 1, wherein the plurality of openings is formed in the second structural layer and is on the same side of the electrical conductors as the die.

21. The method of claim 1, wherein the plurality of openings is formed in the first structural layer and is on an opposite side of the electrical conductors as the die.

22. The method of claim 1, wherein one or more of the openings are formed in the first structural layer and the other opening or openings are formed in the second structural layer, such that one or more openings are on the same side of the electrical conductors as the die and one or more openings are on an opposite side of the electrical conductors as the die.

* * * * *